US012757557B2

(12) United States Patent
Liu et al.

(10) Patent No.: US 12,757,557 B2
(45) Date of Patent: Oct. 6, 2026

(54) WIRING SUBSTRATE, LIGHT-EMITTING SUBSTRATE, AND DISPLAY APPARATUS

(71) Applicants: Hefei BOE Ruisheng Technology Co., Ltd., Hefei (CN); BOE Technology Group Co., Ltd., Beijing (CN)

(72) Inventors: Chunjian Liu, Beijing (CN); Jian Tian, Beijing (CN); Jianying Zhang, Beijing (CN); Jie Lei, Beijing (CN); Yajun Ma, Beijing (CN); Jiawei Xu, Beijing (CN)

(73) Assignees: Hefei BOE Ruisheng Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 336 days.

(21) Appl. No.: 18/702,001

(22) PCT Filed: Nov. 9, 2022

(86) PCT No.: PCT/CN2022/130968

§ 371 (c)(1),
(2) Date: Apr. 17, 2024

(87) PCT Pub. No.: WO2024/098302

PCT Pub. Date: May 16, 2024

(65) Prior Publication Data

US 2025/0241102 A1 Jul. 24, 2025

(51) Int. Cl.
*H10H 29/49* (2025.01)
*H10H 29/39* (2025.01)

(52) U.S. Cl.
CPC ............ *H10H 29/49* (2025.01); *H10H 29/39* (2025.01)

(58) Field of Classification Search
CPC .... H10H 29/39; H10H 29/49; H10H 29/0364; G02F 1/133
USPC ............................................................ 257/91
See application file for complete search history.

(56) References Cited

U.S. PATENT DOCUMENTS

2022/0101801 A1 * 3/2022 Zhang .................... G09G 3/342

FOREIGN PATENT DOCUMENTS

CN 113130463 A 7/2021
CN 114185200 A 3/2022

* cited by examiner

*Primary Examiner* — Moazzam Hossain
(74) *Attorney, Agent, or Firm* — ArentFox Schiff LLP; Michael Fainberg

(57) ABSTRACT

A wiring substrate includes a plurality of functional units arranged in an array. Each of the functional units includes: a plurality of first pad groups arranged along a first direction, and a second pad group located at a side of the plurality of the first pad groups along the second direction. The second pad group includes a plurality of channel pads and at least two functional pads, and a number of pads in the second pad group is even and the pads in the second pad group are arranged at intervals in a 2*N array. The plurality of channel pads are arranged at intervals along a same direction in a first line and are respectively connected one-to-one with a plurality of first pad groups of which a number is same as a number of the plurality of the channel pads.

18 Claims, 19 Drawing Sheets

WIRING SUBSTRATE, LIGHT-EMITTING SUBSTRATE, AND DISPLAY APPARATUS

CROSS-REFERENCE TO RELATED APPLICATIONS

This application is a National Stage of International Application No. PCT/CN2022/130968, filed on Nov. 9, 2022, which is hereby incorporated by reference in its entirety.

TECHNICAL FIELD

The disclosure relates to the technology field of display device, and in particular to a wiring substrate, a light-emitting substrate, and a display apparatus.

BACKGROUND

Currently, glass-based Mini-LED display technology is approaching maturity, with more and more panel manufacturers transitioning to producing Mini-LED display panels. As the technology matures and costs decrease, competition intensifies. For the Back Plane (BP) light board of glass-based Mini-LED direct display devices, a dominant manufacturing process is still a six-mask, double-layer copper process, which means that two metal wire layers are formed. This double-layer copper process on the light board is complex, with low yields and high costs. This double-layer copper process on the light board is complex, with low product yield and high costs.

SUMMARY

Embodiments of the disclosure provide a wiring substrate and a light-emitting substrate, and a display apparatus. The wiring substrate allows the manufacturing process to be greatly simplified, improving the product yield and reducing the manufacturing costs.

For the above objective, embodiments of the disclosure provide following solutions.

A wiring substrate includes: a plurality of functional units arranged in an array. each of the functional units includes: a plurality of first pad groups arranged at intervals along a first direction, where each of the first pad groups includes a first sub-pad and a second sub-pad spaced along a second direction; and a second pad group located at a side of the plurality of the first pad groups along the second direction, where the second pad group includes a plurality of channel pads and at least two functional pads, and a number of pads in the second pad group is even and the pads in the second pad group are arranged at intervals in a 2*N array. The plurality of channel pads are arranged at intervals along a same direction in a first line and are respectively connected one-to-one with a plurality of first pad groups of which a number is same as a number of the plurality of the channel pads; a functional pad in the at least two functional pads is located in the first line and is adjacent to one of the plurality of channel pads; and rest functional pads in the at least two functional pads are arranged at intervals along a same direction in a second line.

Optionally, a plurality of routing wire groups arranged along the second direction are further included. A number of the plurality of routing wire groups is same as a number of columns of functional units, and each of the routing wire groups is connected with a column of functional units. Each of the routing wire groups includes a plurality of connection lines, routing wires of first type and routing wires of second type. The plurality of connection lines are used to connect channel pads respectively to second sub-pads in the column of functional units, the routing wires of first type are connected with functional pads in the column of functional units, and the routing wires of second type are connected with first sub-pads in the column of functional units. The routing wires of first type and the routing wires of second type are arranged along the second direction and extend along the first direction; at least one of the routing wires of first type passes through a gap between the first line and the second line of the second pad group in the column of functional units, and at least one of the routing wires of second type passes through a gap between the first sub-pads and the second sub-pads in the column of functional units, so that routing wires in the plurality of routing wire groups are set in a same layer.

Optionally, in each of the functional units, the plurality of channel pads are arranged respectively adjacent to second sub-pads in the plurality of first pad groups along the second direction, and an arrangement order of the channel pads matches with an arrangement order of corresponding first pad groups.

Optionally, in each of the functional units, the at least two functional pads include a signal pad, an address input pad, an address output pad and at least one ground pad. Any one of the signal pad, the address input pad and the address output pad is located in the first line of the second pad group, and at least one of the address input pad and the address output pad is adjacent to one of other pads in a line where the at least one of the address input pad and the address output pad is located.

Optionally, the routing wires of first type includes: a signal line connected with all signal pads in a corresponding column of functional units; a ground line connected with all ground pads in a corresponding column of functional units; a plurality of cascade lines, configured to cascade every adjacent two functional units in a column of functional units, one end of the cascade line being connected with an address output pad of a previous functional unit and the other end of the cascade line being connected with an address input pad of a next functional unit; and an address line connected with an address input pad of a first one of functional units in a corresponding column of functional units.

Optionally, in each of the functional units, extension directions of the first line and the second line in the second pad group both are the first direction.

Optionally, in each of the functional units, the signal pad is located in the first line of the second pad group; the signal line passes through a gap between the first line and the second line in the second pad group; and the ground line is located at a side of the second pad group away from the first pad groups.

Optionally, in the second pad group, the address input pad is adjacent to one of other pads in a line where the address input pad is located, and the address output pad is adjacent to one of other pads in a line where the address output pad is located; and the cascade line is located between two adjacent functional units in a column of functional units.

Optionally, in the second pad group, one of the address input pad and the address output pad is adjacent to one of other pads in a line where the one of the address input pad and the address output pad is located; and the cascade line is located between the first line and the second line of the second pad group.

Optionally, in each of the functional units, extension directions of the first line and the second line in the second pad group both are the second direction.

Optionally, in each of the functional units, one of the address input pad and the address output pad is located in the first line of the second pad group; and the cascade line is located between two adjacent functional units in a column of functional units.

Optionally, in each of the functional units, the at least one ground pad is adjacent to a functional pad in the first line of the second pad group; the ground line is located at a side of the second pad group away from the first pad groups along the second direction; and the signal line passes through a gap between the first line and the second line of the second pad group.

Optionally, in each of the functional units, the signal pad is adjacent to a functional pad in the first line of the second pad group; the signal line is located at a side of the second pad group away from the first pad groups along the second direction; and the ground line is located between the first line and the second line in the second pad group.

Optionally, the address line is located a side of the routing wires of second type away from the second pad group.

Optionally, the second pad group includes two ground pads which are arranged adjacent to each other.

Optionally, in each of the functional units, the plurality of first pad groups are divided into two types, and first pad groups of a same type are arranged adjacent to each other; the routing wires of second type includes two power lines, and a power line is connected with first pad groups of a type in a column of functional units, where one power line of the two power lines is located at a side of the first pad groups away from the second pad group, and the other one power line of the two power lines passes through a gap between the first sub-pads and the second sub-pads in the first pad groups.

Embodiments of the disclosure further provide a light-emitting substrate, including the wiring substrate according to any one of the technical solutions, and a plurality of light-emitting elements connected one-to-one with the first pad groups and a plurality of driving elements connected one-to-one with the second pad groups.

Embodiments of the disclosure further provide a display apparatus including the light-emitting substrate according to the technical solutions.

In the wiring substrate, the light-emitting substrate and the display apparatus according to embodiments of the disclosure, the wiring substrate includes a plurality of identical functional units arranged in an array. Each of the functional units includes a plurality of first pad groups and a second pad group. The plurality of first pad groups are arranged at intervals along the first direction, and the second pad group is located at a same side of the plurality of first pad groups along the second direction. In the second pad group, a plurality of channel pads are arranged at intervals along the same direction in the first line and are respectively connected one-to-one with the first pad groups whose number is the same as the number of the plurality of channel pads in the functional unit, enabling the routing wires connected with the first pad groups, the routing wires between the first pad groups and the second pad group, and the routing wires connected with the second pad group to be arranged sequentially along the second direction without overlapping, which is conducive to setting all routing wires in the same layer. In the second pad group, one of the at least two functional pad is located in the first line, and this functional pad is adjacent to one channel pad among the plurality of channel pads, which means that one functional pad is positioned at an end of the first line of the second pad group; and the remaining functional pads of the at least two functional pad are arranged at intervals along the same direction in the second line. Compared with the technical solutions in related art, the number of functional pads in the second pad group is increased, the position of the functional pad is adjusted; the type of signals received by the functional pads can further be adjusted, the shape and extension direction of the routing wires connected with the second pad group can be changed, which allow all routing wires to be arranged in the same layer in the wiring substrate, greatly simplifying the manufacturing process of the wiring substrate, improving product yield, and reducing the amount of mask boards used, significantly reducing production costs.

1—Substrate; 2—Buffer layer; 3—Metal routing wire layer; 31—Functional unit; 311, 3111, 3112, 3113—First pad group; 312—Second pad group; 3121—First line; 3122—Second line; 32—Routing wire group; 321—Connection line; 322—Routing wire of first type; 323—Routing wire of second type; 4—Insulation layer; 41—Opening.

DETAILED DESCRIPTION

Technical solutions of embodiments of the disclosure are described clearly and completely below with reference to the drawings of embodiments of the disclosure. Apparently, the described embodiments are some, not all, of embodiments of the disclosure. Based on the described embodiments of the disclosure, all other embodiments obtained by those of ordinary skill in the art without inventive efforts fall within the protection scope of the disclosure.

Figure 1:
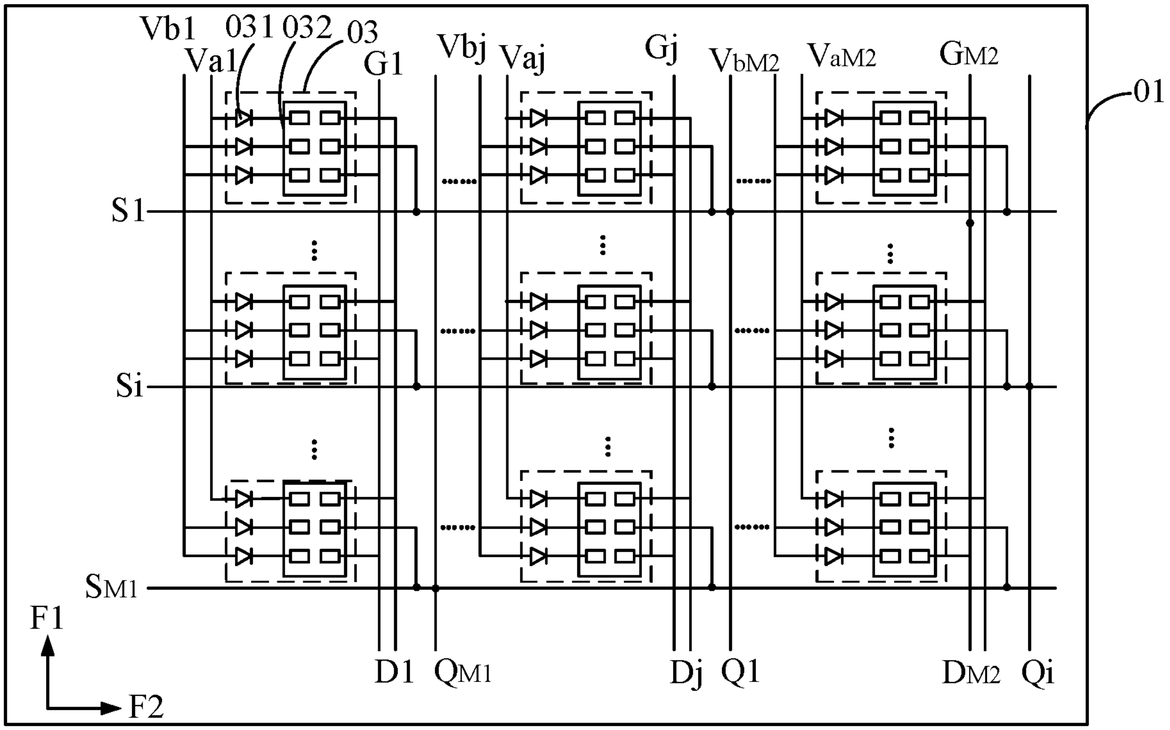
FIG. 1 is a schematic structural diagram illustrating a connection between pads and routing wires on a light-emitting substrate in the related art.
Figure 2:
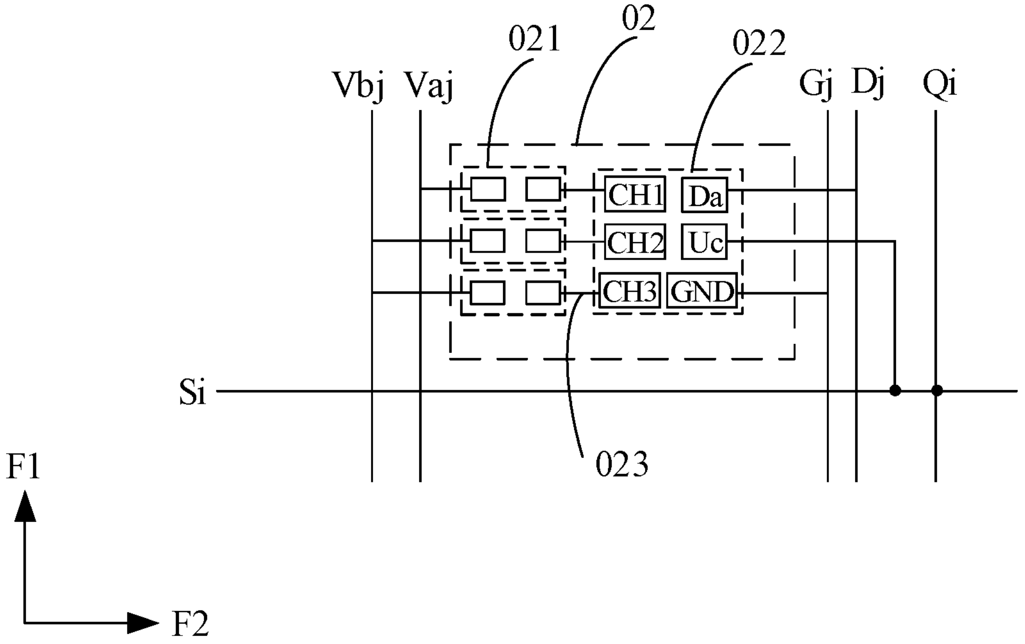
FIG. 2 is a schematic structural diagram illustrating a connection between a functional unit and routing wires in the related art.

In the related art, a light-emitting substrate includes a substrate 01, M1*M2 functional units 02 arranged in an array on the substrate, M1 address signal lines S, M1 address signal transfer lines Q, M2 data lines D, M2 ground lines G, M2 first power lines Va, M2 second power lines Vb, and a plurality of pixel units, as shown in FIG. 1 which is a schematic structural diagram illustrating the connection in the light-emitting substrate in related art, and FIG. 2 which is a schematic structural diagram of the connection of a functional unit in related art.

Here, the plurality of functional units 02 are arranged in an array in the first direction F1 and the second direction F2, with the first direction F1 intersecting the second direction F2. The functional unit 02 includes a plurality of first pad groups 021 and one second pad group 022. The second pad group 022 includes channel pads CH (such as CH1, CH2, and CH3) corresponding to the first pad groups in the functional unit, a data signal pad Da, an address pad Uc, and a ground pad GND. The channel pads can be connected one-to-one with the first pad groups 021 via connection wires 023. The data signal pad Da, address pad Uc, ground pad GND are functional pads.

A plurality of pixel units 03 are connected one-to-one with the plurality of functional units 02. The pixel unit 03 includes a plurality of light-emitting elements 031 and a driving element 032. The number of pads in the first pad group 021 in the functional unit is the same as the number of pins of the light-emitting element 031, and the pins of the light-emitting element 031 are connected one-to-one with the pads in the first pad group 021. The number of pads in the second pad group 022 in the functional unit is the same as the number of pins of the driving element 032, and the pins of the driving element 032 are connected one-to-one with the pads in the second pad group 022, for driving the light-emitting element 031 to emit light.

It should be noted that the first direction F1 can be the row direction of the plurality of functional units arranged in an array, and the second direction F2 can be the column direction of the plurality of functional units arranged in an array. Alternatively, the first direction F1 can be the column direction of the plurality of functional units arranged in an array, and the second direction F2 can be the row direction of the plurality of functional units arranged in an array, which is not limited here. For illustration purposes, in embodiments of the disclosure, the first direction F1 is the column direction and the second direction F2 is the row direction. The value of M1 is equal to the number of rows of functional units, and the value of M2 is equal to the number of columns of functional units.

Each address signal line Si ($0<i\leq M1$, and i is a positive integer) is coupled with the address pads Uc in the second pad groups of a row of functional units arranged in the second direction F2, for providing address data to the pixel units.

Each address signal transfer line Qi ($0<i\leq M1$, and i is a positive integer) corresponds to the address signal line Si in a one-to-one manner.

Each data line Dj ($0<j\leq M2$, and j is a positive integer) is coupled with the data signal pads Da in the second pad groups of a column of functional units arranged in the first direction F1, for providing data signals to the pixel units.

The ground line Gj ($0<j\leq M2$, and j is a positive integer) is coupled with the ground pads GND in the second pad groups of a column of functional units arranged in the first direction F1, for providing ground voltage signals to the pixel units.

The first power line Vaj and the second power line Vbj are coupled with a column of first pad groups arranged in the first direction F1. Each second sub-pad of each of the first pad groups is coupled with each of the channel pads CH of the second pad group.

During the driving process of the light-emitting substrate, in an address allocation phase, addressing information is sequentially transmitted to the address pad through each address signal line. The addressing information includes an address ID of a corresponding pixel row, so that the driving elements 032 can obtain specific address IDs respectively. In a data signal transmission phase, data information is transmitted to each pixel column through each data line. The data information includes an address ID and pixel data information corresponding to each driving element in a certain pixel column, so that each driving element can accurately obtain pixel data information matching its own address ID. The pixel data information is parsed and packetized to form electrical signals for controlling the connected light-emitting elements respectively, achieving active addressing drive.

Figure 3:
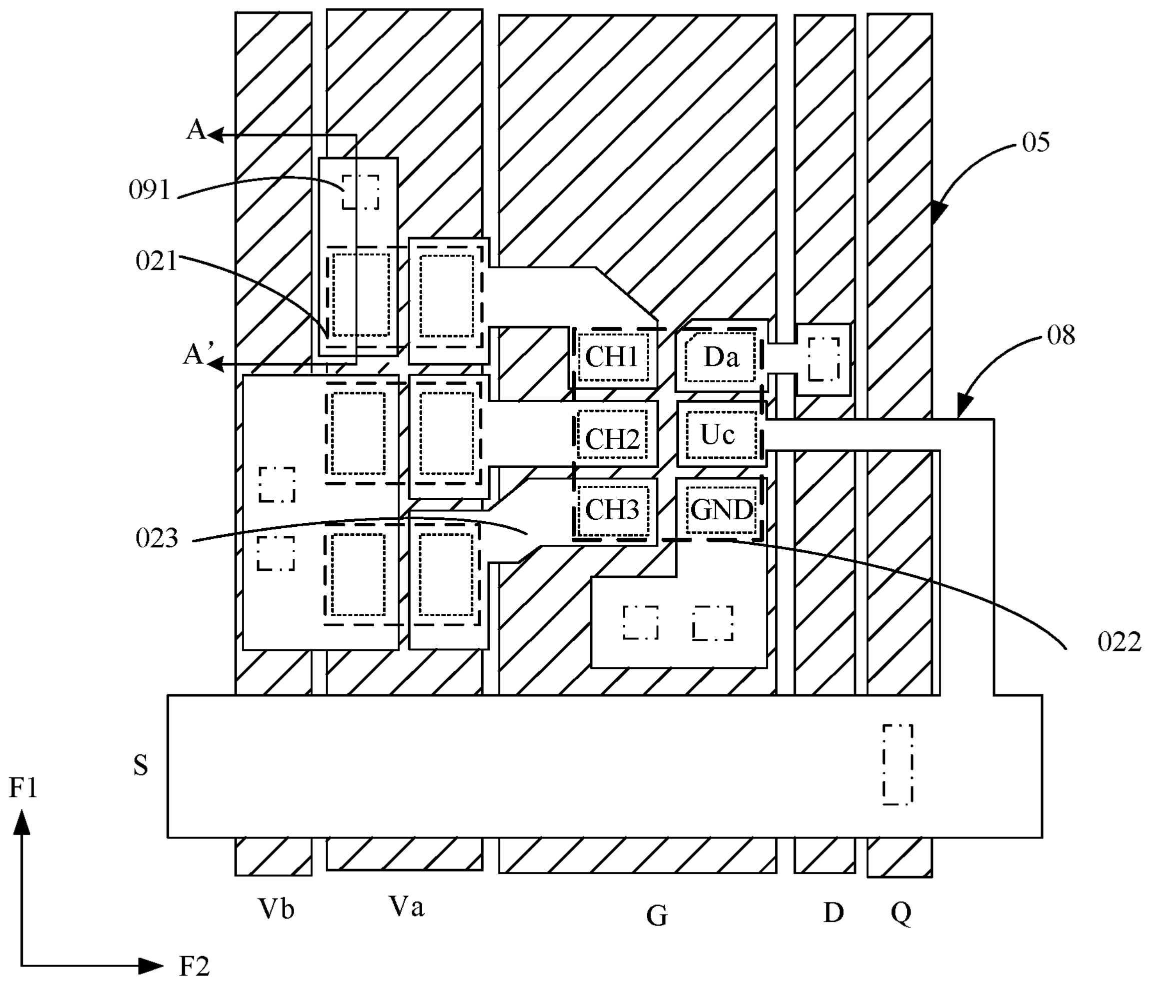
FIG. 3 is a schematic structural diagram of a functional unit and routing wires in the related art.
Figure 4:
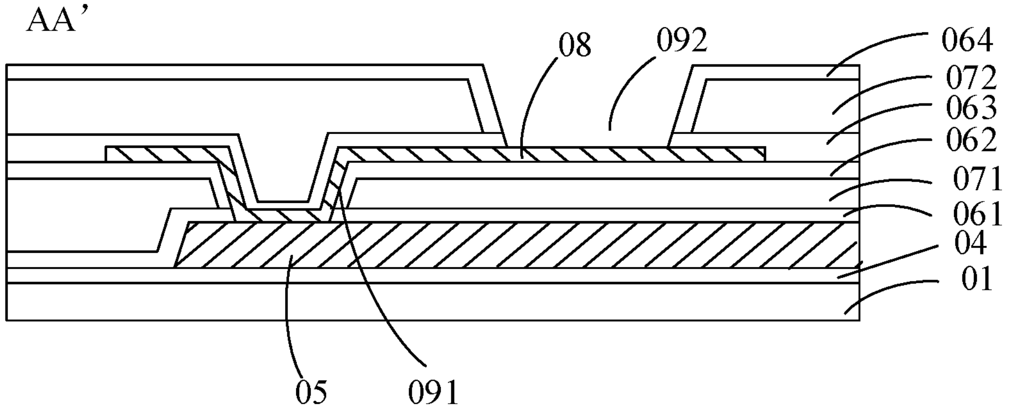
FIG. 4 is a sectional view along a section line AA' in FIG. 3.

The specific wiring structure diagram and sectional view of a functional unit 02 in the light-emitting substrate are shown in FIGS. 3 and 4 respectively. FIG. 4 is a sectional view along the section line AA' in FIG. 3. In the manufacturing process, the light-emitting substrate includes a substrate 01, a buffer layer 04, a first metal routing wire layer 05, a first insulation layer 061, a first planarization layer 071, a second insulation layer 062, a second metal routing wire layer 08, a third insulation layer 063, a second planarization layer 072, and a fourth insulation layer 064. Here, as shown in FIG. 3, the M1 address signal transfer lines Q, M2 data lines D, M2 ground lines G, M2 first power lines Va, M2 second power lines Vb, etc., can belong to the first metal routing wire layer, a plurality of functional units 02, connection wires 023, and M1 address signal lines S can belong to the second metal routing wire layer 08, forming a double-layered routing wire layer. The routing wires in the first metal routing wire layer 05 are connected with the first pad groups 021 and the second pad group 022 of the functional units through a via 091 running through the first insulation layer 061, the first planarization layer 071, and the second insulation layer 062. The light-emitting element can be connected with the first pad groups 021 and the second pad group 022 of the functional unit through a via 092 running through the third insulation layer 063, the second planarization layer 072, and the fourth insulation layer 064.

In the second metal routing wire layer 08 shown in FIG. 3, the pads in the functional unit 02 are integrated with the routing wires in connection. Each pad is a part exposed by the via 092 formed through the third insulation layer 063, the second planarization layer 072, and the fourth insulation layer 064, while the routing wires in the second routing wire layer 08 are parts that covered and protected by the third insulation layer 063, the second planarization layer 072, and the fourth insulation layer 064.

The structure of the above double-layered metal routing wire layer requires a plurality of patterning processes during manufacturing, including: (1) patterning the first metal routing wire layer 05; (2) patterning the first insulation layer 061 and the first planarization layer 071; (3) patterning the second insulation layer 062; (4) patterning the second metal routing wire layer 08; (5) patterning the third insulation layer 063 and the second planarization layer 072; (6) patterning the fourth insulation layer 064. It can be seen that the manufacturing process of the double-layered metal routing wire layer is complex, which may lead to lower product yield and higher cost.

Figure 5:
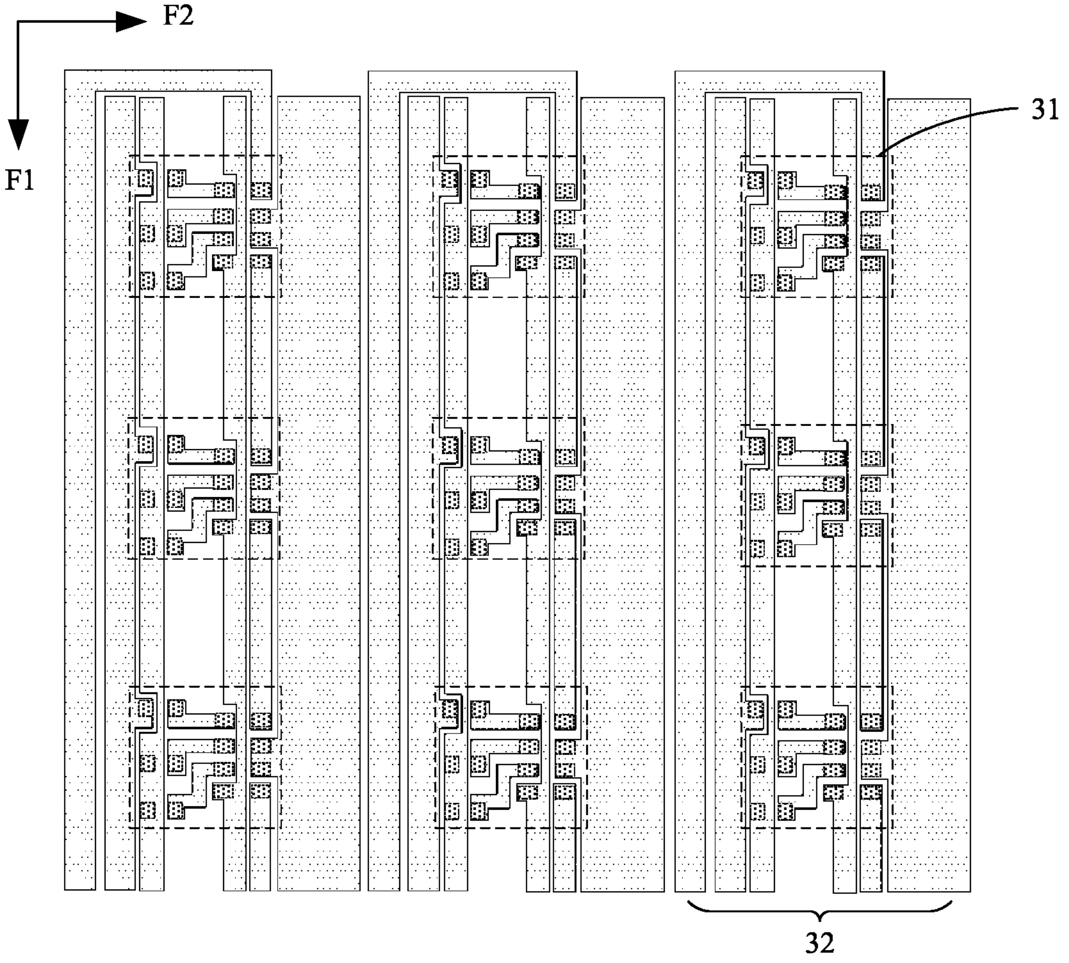
FIG. 5 is a schematic structural diagram of a functional unit and routing wires on a wiring substrate according to embodiments of the disclosure.
Figure 6:
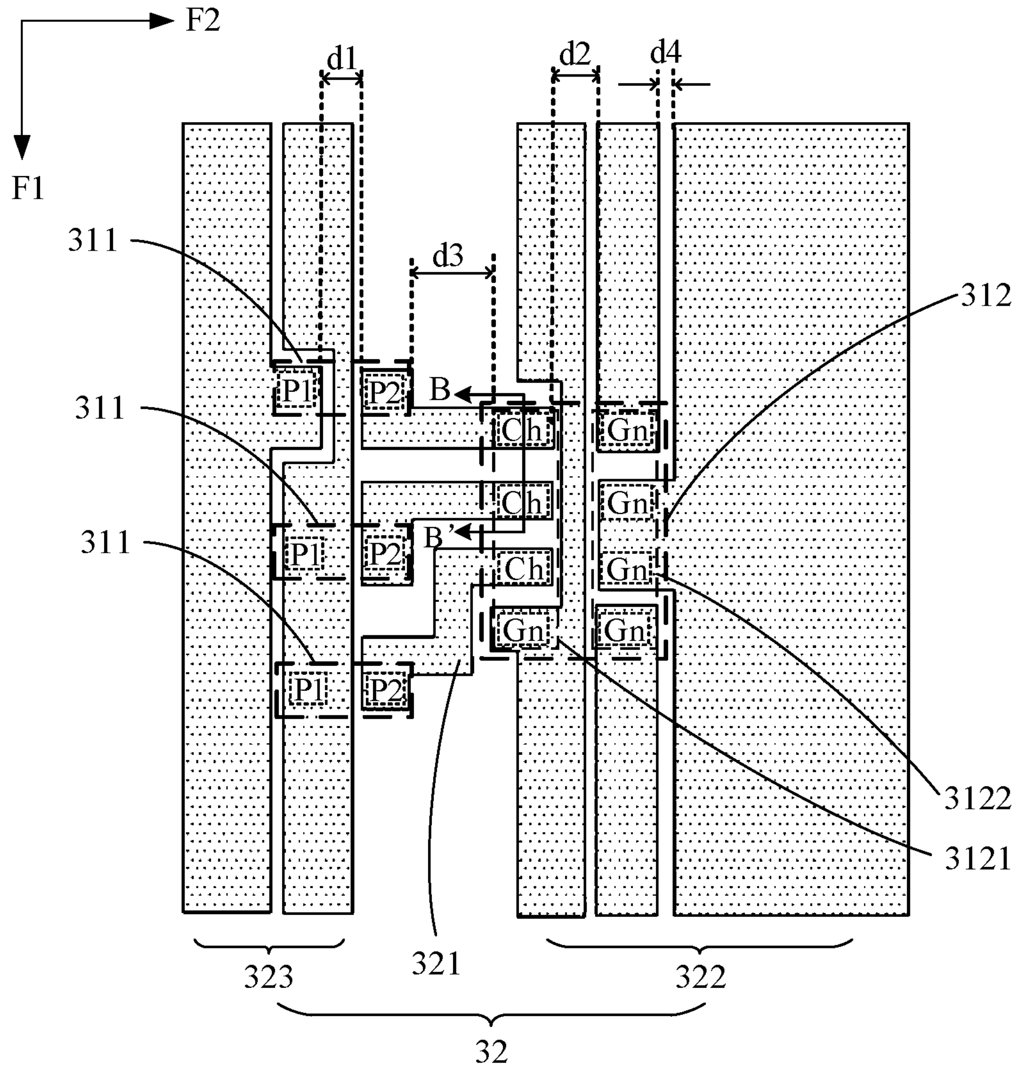
FIG. 6 is a sectional view along a section line BB' in FIG. 5.

To overcome the above technical problems, embodiments of the disclosure provide a wiring substrate, as shown in FIGS. 5 and 6, including: a plurality of functional units 31 arranged in an array. Each of the functional units 31 includes:

- a plurality of first pad groups 311, where the first pad groups 311 are arranged at intervals along the first direction F1, each of the first pad groups 311 includes a first sub-pad P1 and a second sub-pad P2 spaced along the second direction F2;
- a second pad group 312, where the second pad group 312 is located at a side of the plurality of first pad groups 311 along the second direction F2, and the second pad group 312 includes a plurality of channel pads Ch at least two functional pads Gn, and the number of pads in the second pad group 312 is even, and the pads in the second pad group are arranged at intervals in a 2*N array;
- here, the plurality of channel pads Ch are arranged at intervals along a same direction in a first line 3121 and are respectively connected with a plurality of first pad groups 311 of which a number is same as a number of the plurality of channel pads; a functional pad Gn in the at least two functional pads Gn is located in the first line 3121 and is adjacent to one channel pad Ch in the plurality of channel pads Ch; rest functional pads Gn in the at least two functional pads Gn are arranged along a same direction in a second line 3122.

In the wiring substrate according to embodiments of the disclosure, a plurality of identical functional units 31 arranged in an array are included. Each of the functional units 31 includes a plurality of first pad groups 311 and a second pad group 312. The plurality of first pad groups 311 are arranged at intervals along the first direction F1, and the second pad group 312 is located at a same side of the plurality of first pad groups 311 along the second direction F2. In the second pad group 312, a plurality of channel pads Ch are arranged at intervals along the same direction in the first line 3121 and are respectively connected one-to-one with the first pad groups 311 whose number is the same as the number of the plurality of channel pads Ch in the functional unit 31, enabling the routing wires connected with the first pad groups 311, the routing wires between the first pad groups 311 and the second pad group 312, and the routing wires connected with the second pad group 312 to be arranged sequentially along the second direction F2 without overlapping, which is conducive to setting all routing wires in the same layer. In the second pad group 312, one of the at least two functional pad Gn is located in the first line 3121, and this functional pad Gn is adjacent to one channel pad Ch among the plurality of channel pads Ch, which means that one functional pad Gn is positioned at an end of the first line 3121 of the second pad group 312; and the remaining functional pads Gn of the at least two functional pad Gn are arranged at intervals along the same direction in the second line 3122. Compared with the technical solutions in related art, the number of functional pads Gn in the second pad group 312 is increased, the position of the functional pad Gn is adjusted; the type of signals received by the functional pads Gn can further be adjusted, the shape and extension direction of the routing wires connected with the second pad group 312 can be changed, which allow all routing wires to be arranged in the same layer in the wiring substrate, greatly simplifying the manufacturing process of the wiring substrate, improving product yield, and reducing the amount of mask boards used, significantly reducing production costs.

Figure 7:
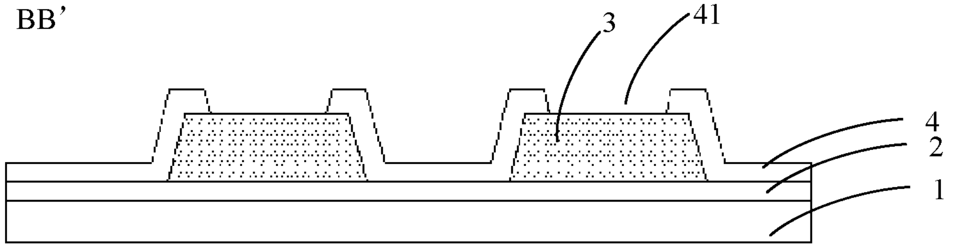
FIG. 7 is a sectional view of a wiring substrate according to embodiments of the disclosure.

As shown in FIG. 7 which is a sectional view along the section line BB' in FIG. 6, the wiring substrate includes a substrate 1, a buffer layer 2, a metal routing wire layer 3, and an insulation layer 4 stacked sequentially. In the manufacturing process of the wiring substrate, just 2 mask processes are required, including: (1) patterning the metal routing wire layer 3 to form metal routing wires; (2) patterning the insulation layer 4 to form openings 41. Through the openings 41 in the insulation layer 4, the pads in the functional unit 31 can be defined in preset areas of the metal routing wires, and the pixel units can be connected with the parts of the metal routing wires exposed by the openings 41. The pixel unit can include a plurality of light-emitting elements and a driving element. The light-emitting elements can be connected with the first pad groups 311, and the driving element can be connected with the second pad group 312. It can be seen that the structure of the wiring substrate according to embodiments of the disclosure allows the manufacturing process of the wiring substrate to be greatly simplified.

In practical applications, pins of the light-emitting elements are rectangular, with a width ranging from 30 μm to 50 μm and a length ranging from 50 μm to 75 μm. The length and width of the first sub-pad P1 and the second sub-pad P2 in the corresponding first pad group 311 are larger than the length and width of the pins of the light-emitting elements by 2 μm to 30 μm, respectively. The pins of the driving element are rectangular, with a width generally ranging from 30 μm to 50 μm and a length ranging from 45 μm to 70 μm. The length and width of the pads in the corresponding second pad group 312 are larger than the length and width of the pins of the driving element by 2 μm to 30 μm, respectively. A width d1 of a gap between the first sub-pad P1 and the second sub-pad P2 in the first pad group 311 can range from 50 μm to 200 μm, and a width d2 of a gap between the two lines in the second pad group 312 can range from 50 μm to 200 μm. Since the arrangement of the first pad groups determines the arrangement of the subsequent light-emitting elements, and the arrangement of the light-emitting elements has a decisive impact on the display effect, after the positions of the first pad groups 311 are determined, the position of the second pad group 312 not only needs to satisfy the design requirements of the routing wires but also needs to balance the distance from the first pad groups 311. As long as a distance d3 between the second pad group 312 and the first pad groups 311 is greater than or equal to 100 μm, the spatial requirements for repairing light-emitting elements can be met.

In embodiments of the disclosure, as shown in FIGS. 5 and 6, the wiring substrate can include a plurality of routing wire groups 32 arranged along the second direction F2. The number of the plurality of routing wire groups 32 is the same as the number of columns of functional units 31, and each of the routing wire groups 32 is connected with one column of functional units 31. Each of the routing wire groups 32 includes a plurality of connection lines 321, routing wires of first type 322, and routing wire of second type 323. The connection lines 321 are used to connect the channel pads Ch respectively to the second sub-pads P2 in a column of functional units 31, the routing wires of first type 322 are connected with the functional pads Gn in the column of functional units 31, and the routing wires of second type 323 are connected with the first sub-pads P1 in the column of functional units 31. Here, the routing wires of first type 322 and the routing wires of second type 323 are arranged along the second direction F2 and extend along the first direction F1, allowing the general directions of the routing wires of first type 322 and the routing wires of second type 323 to be consistent, avoiding mutual overlapping of the routing wires of first type 322 and the routing wires of second type 323, which is conducive to setting all routing wires in the same layer. At least one of the routing wires of first type 322 passes through the gap between the first line 3121 and the second line 3122 of the second pad groups 312 in one column of functional units 31, and at least one of the routing wires of second type 323 passes through the gap between the first sub-pad P1 and the second sub-pads P2 in the column of functional units 31. By setting some routing wires in the routing wires of first type 322 and the routing wires of second type 323 through the gaps between the pads, all routing wires in the routing wire groups 32 can be arranged in the same layer, simplifying the structure of the wiring substrate, reducing the difficulty of production, and thus reducing production costs.

In practical applications, as shown in FIG. 6, a distance d4 between two adjacent routing wires among the routing wires of first type 322 and the routing wires of second type 323 can range from 5 μm to 100 μm, which can be set according to actual conditions. The width of the routing wires of first type 322 and the routing wires of second type 323 varies depending on the specific functionality of the routing wires, and the required line width for routing wires should be set based on practical considerations without limitations here.

Figure 8:
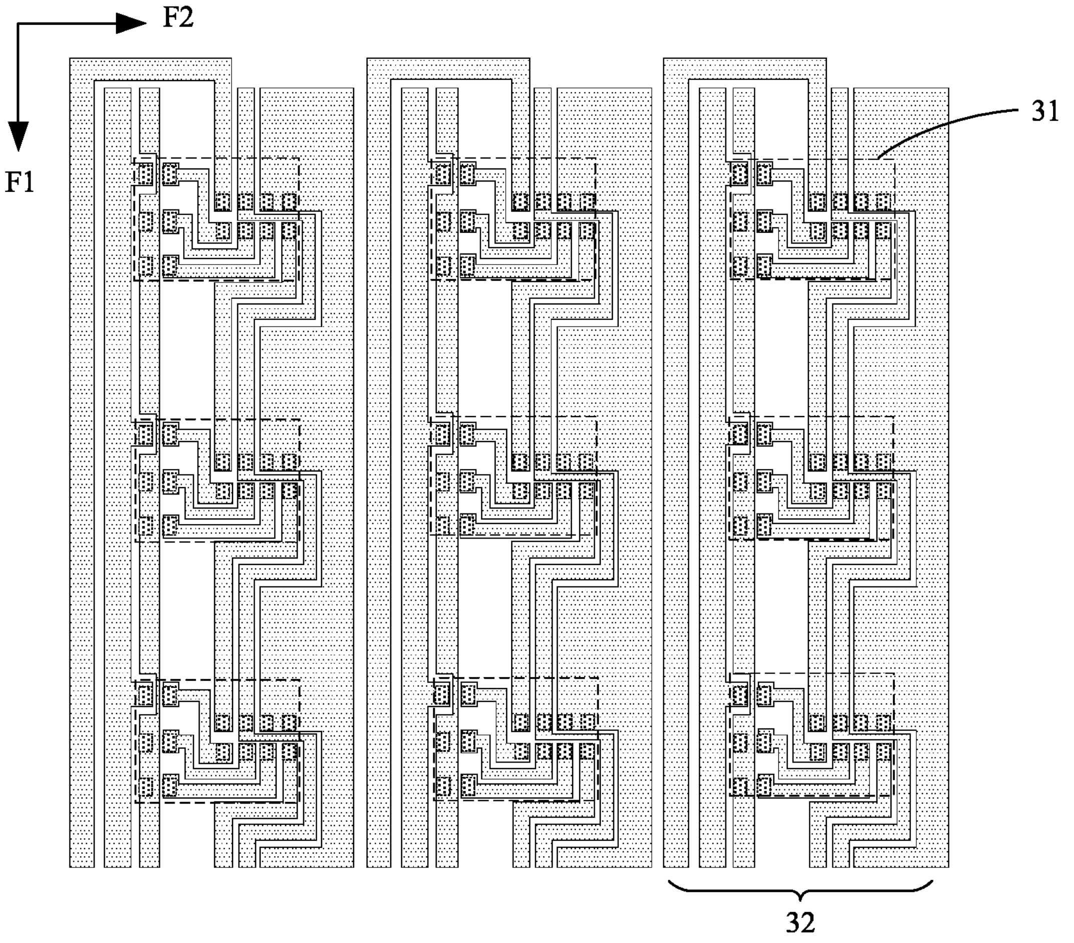
FIG. 8 is a schematic structural diagram of a functional unit and routing wires on another wiring substrate according to embodiments of the disclosure.
Figure 9:
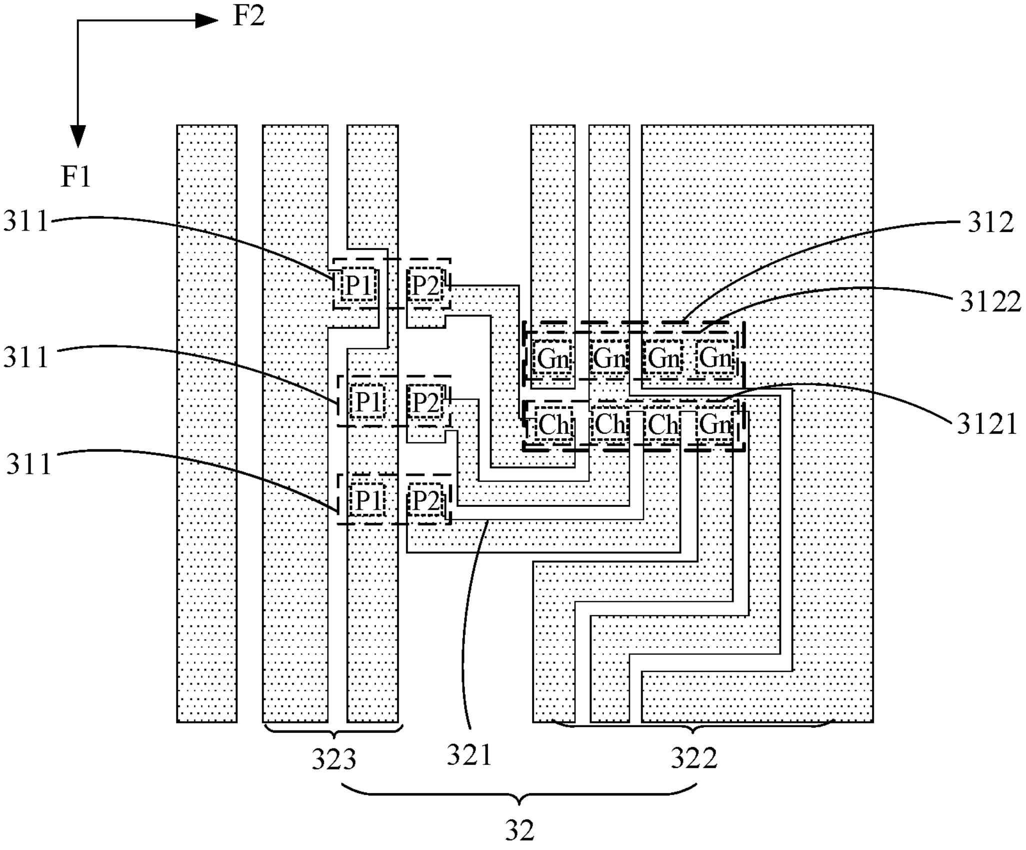
FIG. 9 is a schematic diagram illustrating a connection between a first pad group and a second pad group according to embodiments of the disclosure.

In embodiments of the disclosure, extension directions of the two lines of pads 312 in the second pad group within a functional unit 31 can be the first direction F1, as shown in FIGS. 5 and 6. Alternatively, extension directions the two lines of pads 312 in the second pad group within a functional unit 31 can be the second direction F2, as shown in FIGS. 8 and 9, by rotating the second pad group 312 counterclockwise by 90 degrees relative to FIGS. 5 and 6. Depending on the extension direction of the two lines of pads 312 in the second pad group 312, adaptive adjustments need to be made to the specific positions of the pads in the second pad group 312 and the specific routing direction of the routing wires. Those skilled in the art can determine these adjustments based on embodiments of the disclosure according to actual conditions.

In each of the functional units 31, the plurality of channel pads Ch are arranged respectively adjacent to the second sub-pads P2 of the plurality of first pad groups 311 in the second direction F2. This arrangement allows the connection wires between the second sub-pads P2 and the channel pads Ch to be positioned between the first pad group 311 and the second pad group 312 within the functional unit 31. The arrangement order of channel pads Ch matches with the arrangement order of corresponding first pad groups 311, ensuring sequential connections between the second sub-pads P2 in each corresponding first pad group 311 and the channel pads Ch in the second pad group 312. Each connection wire 321 can be set in the same layer as the routing wires of first type 322 and the routing wires of second type 323, and they are mutually insulated without crossing.

Figure 10:
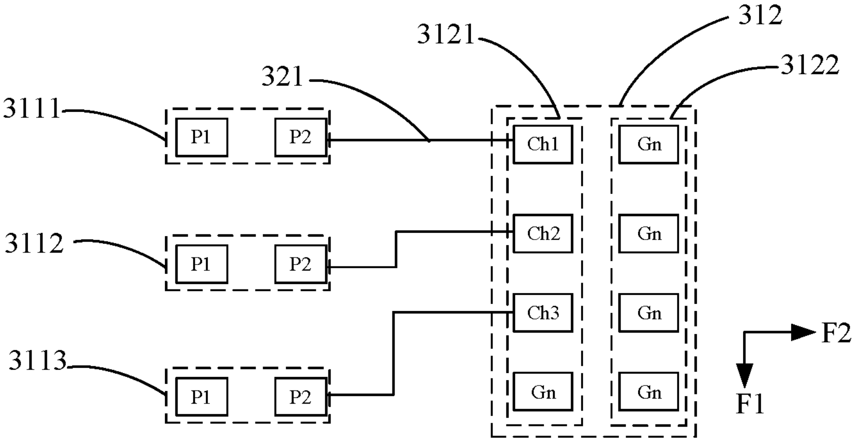
FIGS. 10-15 are schematic diagrams illustrating layouts of pads in a functional unit according to embodiments of the disclosure.
Figure 11:
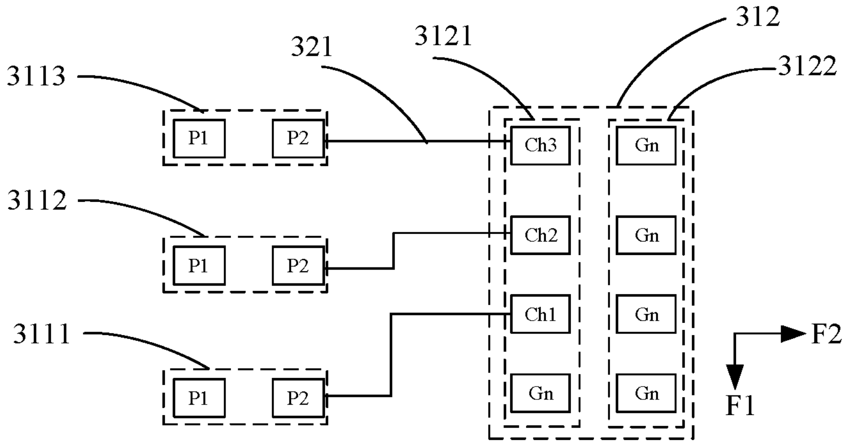
Figure 12:
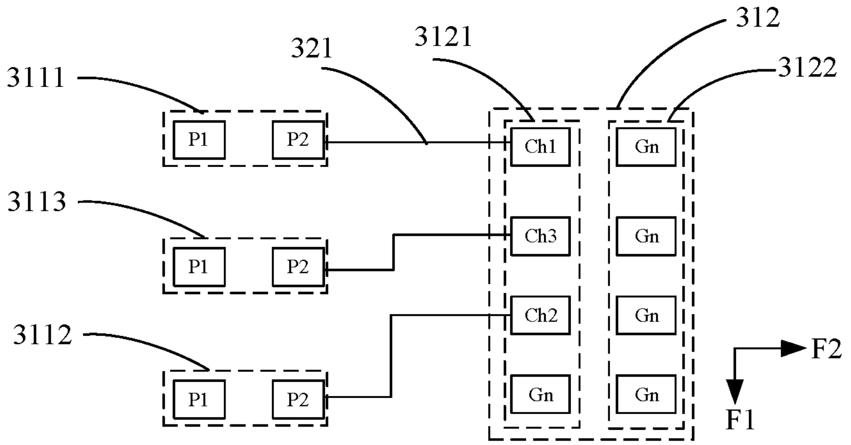
Figure 13:
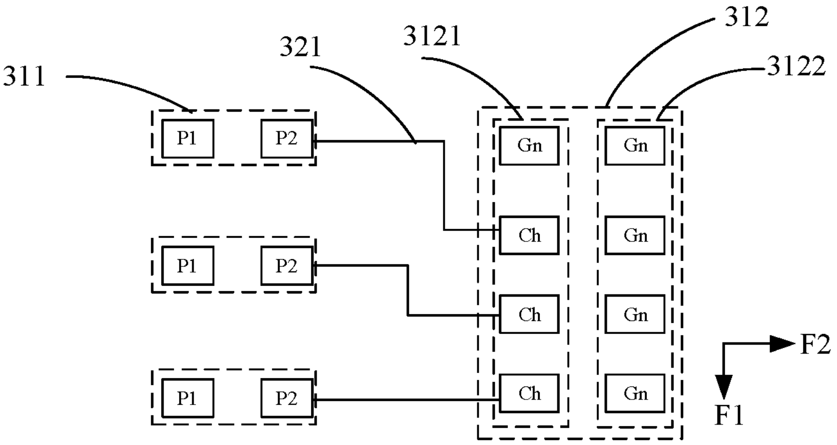

In practical applications, a functional unit 31 may include a first pad group 3111 connected with a red light-emitting element, a first pad group 3112 connected with a green light-emitting element, and a first pad group 3113 connected with a blue light-emitting element. The second pad group 312 of the functional unit 31 includes a first channel pad Ch1 connected with the first pad group 3111, a second channel pad Ch2 connected with the first pad group 3112, and a third channel pad Ch3 connected with the first pad group 3113. As shown in FIGS. 10, the two lines in the second pad group 312 of the functional unit 31 extend along the first direction F1, and the first line 3121 is positioned on a side of the second pad group 312 adjacent to the first pad group 311, allowing the first channel pad Ch1, the second channel pad Ch2, and the third channel pad Ch3 to be positioned adjacent to the first pad groups 311. The first pad group 3111, the first pad group 3112, and the first pad group 3113 are arranged in the first direction F1, and a sequence of arrangement of the first channel pad Ch1, the second channel pad Ch2, and the third channel pad Ch3 in the first direction F1 matches a sequence of arrangement of the first pad groups 3111, 3112, and 3113 in the first direction F1, ensuring that the three connection lines are arranged sequentially and insulated from each other. For example, as shown in FIG. 10, the first pad groups 3111, 3112, and 3113 are arranged sequentially in the first direction F1, and the first channel pad Ch1, the second channel pad Ch2, and the third channel pad Ch1 are also arranged sequentially in the first direction F1. Alternatively, as shown in FIG. 11, if the positions of the first pad groups 3111 and 3113 in FIG. 10 are exchanged, the positions of the corresponding first channel pad Ch1 and the third channel pad Ch3 are exchanged accordingly. Alternatively, as shown in FIG. 12, if the positions of the first pad groups 3112 and 3113 in FIG. 10 are exchanged, the positions of the corresponding second channel pad Ch2 and the third channel pad Ch3 are exchanged accordingly. Additionally, as shown in FIG. 13, the positions of the three channel pads Ch in the first line 3121 of the second pad group 312 can also be exchanged with the positions of the functional pads Gn. The arrangement of the plurality of first pad groups 311 and the plurality of channel pads Ch can be determined according to actual conditions.

Figure 14:
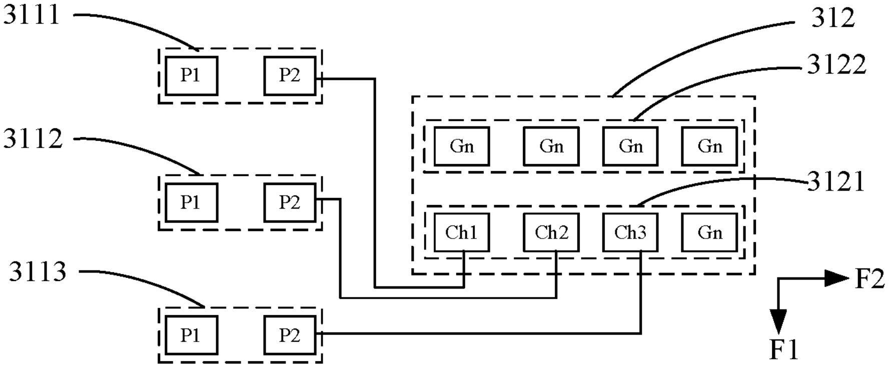
Figure 15:
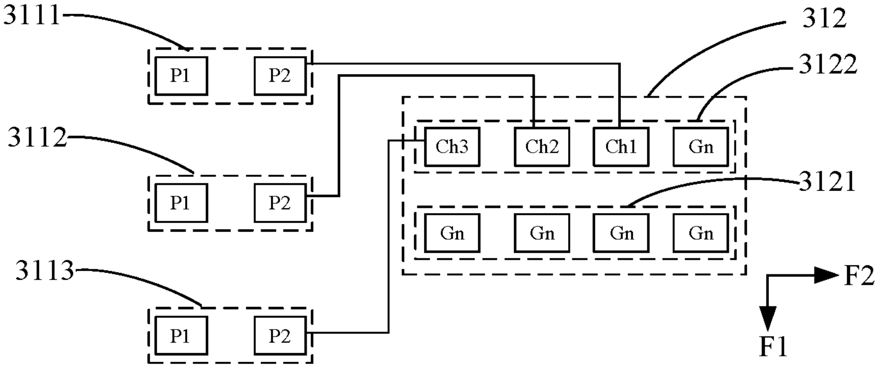

Optionally, as shown in FIG. 14, extension directions of the two lines of pads in the second pad group 312 of the functional unit 31 can be the second direction F2, and the channel pads Ch in the second pad group 312 can be positioned adjacent to the first pad group 311 in the first line 3121. If the first pad groups 3111, 3112, and 3113 are arranged sequentially in the first direction F1, then the first channel pad Ch1, the second channel pad Ch2, and the third channel pad Ch3 are arranged sequentially in the second direction F2. Alternatively, the order of the three first pad groups can be changed, and the positions of the corresponding three channel pads can be exchanged to have the same arrangement. Additionally, as shown in FIG. 15, the positions of the first line 3121 and the second line 3122 of the second pad group 312 can be exchanged, and the positions of the corresponding three channel pads need to be adjusted accordingly. The arrangement of the plurality of first pad groups 311 and the plurality of channel pads Ch can be determined according to actual conditions.

Figure 16:
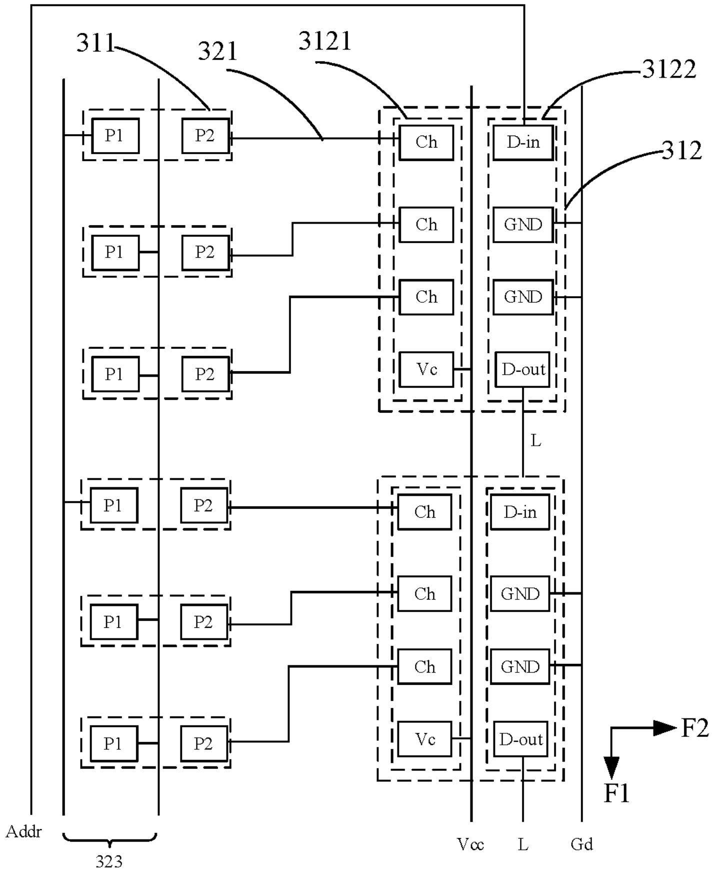
FIGS. 16-29 are schematic diagrams illustrating connections between a second pad group and routing wires of a first type according to embodiments of the disclosure.

In embodiments of the disclosure, in each of the functional units 31, as shown in FIG. 16, at least two functional pads Gn can include a signal pad Vc, an address input pad D-in, an address output pad D-out, and at least one ground pad GND. Here, any one of the signal pad Vc, the address input pad D-in, and the address output pad D-out can be located in the first line 3121 of the second pad group 312, and at least one of the address input pad D-in and the address output pad D-out is adjacent to one of other pads in the same line, facilitating wire connection at the end of the second pad group 312 and the layout of the single-layer metal routing wire layer 3. In the second pad group 312 of the functional unit 31, the functions of data signal pad Da and address pad Uc in the double-layered metal routing wire layer 3 of related art are respectively replaced by the address input pad D-in and the address output pad D-out, and the functions of the pins of the driving element in corresponding connection with the second pad group 312 also need to be redefined. This can be achieved by adjusting the internal logic control circuit and function of the driving element to realize the configuration of the single-layer metal routing wire layer 3 on the wiring substrate.

To ensure the stability of the connection between the second pad group and the driving element, the two lines of pads in the second pad group 312 need to be symmetrically arranged. Therefore, the at least one ground pad GND in the second pad group 312 can include two ground pads GND, which can be adjacent to each other in the second line 3122 of the second pad group 312, facilitating connection with the corresponding routing wire Gd.

As shown in FIG. 16, the specific layout structure of the wiring substrate corresponding to FIG. 16 can be as shown in FIGS. 5 and 6. The routing wires of first type 322 can include a signal line Vcc, a ground line Gd, a plurality of cascade lines L, and an address line Addr. The signal line Vcc is connected with all signal pads Vc in the corresponding column of functional units 31. The ground line Gd is connected with all ground pads GND in the corresponding column of functional units 31. The plurality of cascade lines L are used to cascade every adjacent two functional units 31 in the column of the functional units 31, one end of the cascade line L is connected with the address output pad D-out of a previous functional unit 31, and the other end the cascade line L is connected with the address input pad D-in of a next functional unit 31. The address line Addr is connected with the address input pad D-in of the first one of functional unit 31 in the corresponding column of functional units 31.

In embodiments of the disclosure, the signal line Vcc connected with the signal pads Vc in the corresponding column of functional units 31 is configured to provide data including address information and light emission information, and the address line Addr and the plurality of cascade lines L are configured to provide specific address information. By adjusting the functions and quantities of the pads in the functional unit 31 as well the functions and layout of the routing wires, routing wires can be avoided to be mutually crossed with each other and achieve the setting of the routing wires of first type 322 in the same layer as the connection wires 321, realizing single-layer wiring of the wiring substrate.

Before the light-emitting substrate including the wiring substrate is powered on for display, certain address information is provided sequentially to the driving elements through the address line Addr and the cascade line L. In the display phrase, the signal transmitted on the signal line Vcc is the power carrier signal which includes a power signal for providing working voltage to the driving element and the address data signal and light emission data signal. Each driving element gets the light emission data matching with its address information from the data transmitted on the signal line Vcc, and processes and operates on the light emission data internally. The driving element and the light-emitting element are controlled to form a signal path through a connection line, to allow the light-emitting element to appear at specific grayscale brightness, which is different from the driving method in the related art.

In each of the functional units 31, the extension directions of the first line 3121 and the second line 3122 of the second pad group 312 can be different, resulting in different routing wire layouts of the wiring substrate.

The extension directions of the first line 3121 and the second line 3122 of the second pad group 312 can both be the first direction F1. In this case, the pads and layout of routing wires in each of the functional units 31 can be set according to the following structure.

As shown in FIG. 16, since the channel pads Ch in the second pad group 312 of the functional unit 31 need to be adjacent to the plurality of first pad groups 311, in each of the functional units 31, the signal pad Vc can be located in the first line 3121 of the second pad group 312, which is in the same line as the plurality of channel pads Ch; the signal line Vcc can pass through the gap between the first line 3121 and the second line 3122 of the second pad group 312; the ground line Gd can be located on the side of the second pad group 312 away from the first pad group 311, avoiding interference between the signal line Vcc and the ground line Gd and other routing wires and achieving same-layer setting.

Figure 17:
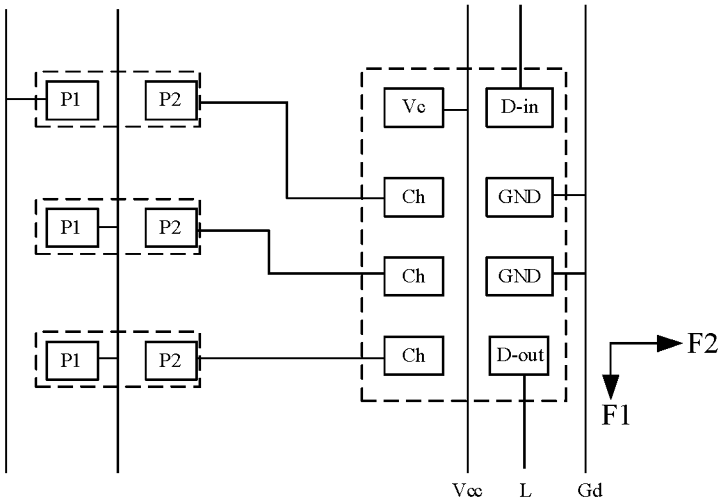

As shown in FIG. 17, in the first line 3121 of the second pad group 312 of the functional unit 31, the positions of the signal pad Vc and the plurality of channel pads Ch can be exchanged. The specific order of the signal pad Vc and the plurality of channel pads Ch is not limited here and can be determined according to actual conditions. The arrangement of the plurality of channel pads Ch can be one of the above technical solutions, which is not limited here and can be determined according to actual conditions.

Optionally, as shown in FIGS. 16 and 17, in the second pad group 312, both the address input pad D-in and the address output pad D-out are adjacent to only one of other pads in the same line, that is, both the address input pad D-in and the address output pad D-out are located at the end of the second line 3122 of the second pad group 312. In this way, the cascade lines L can be located between two adjacent functional units 31 in the same column of the functional units, avoiding interference with other routing wires.

Figure 18:
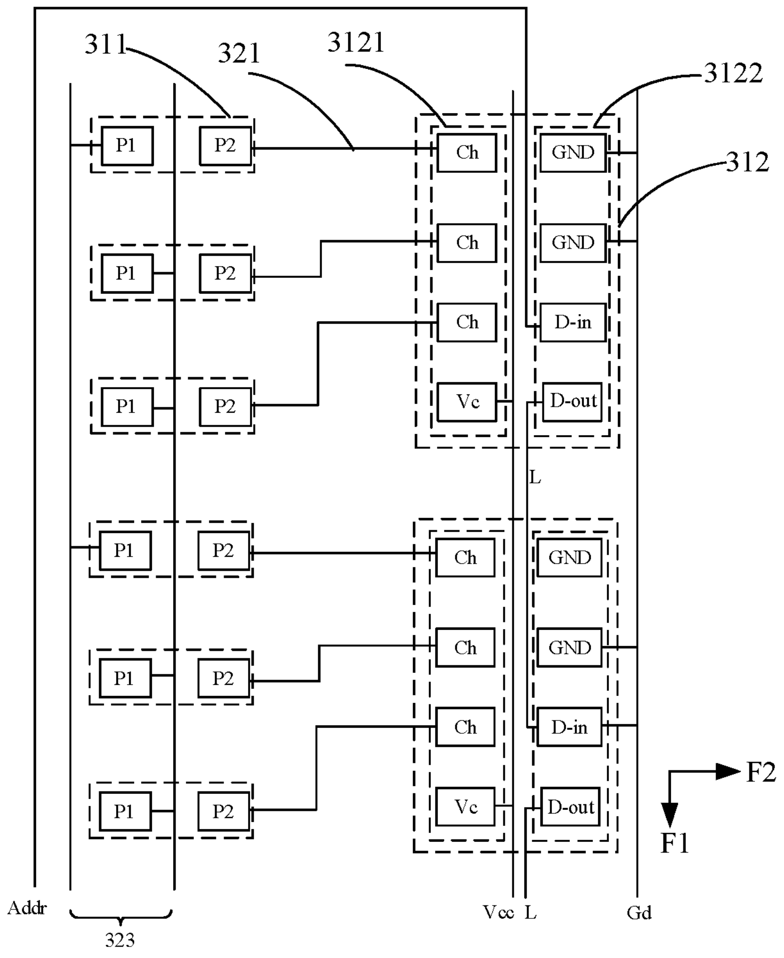

Optionally, as shown in FIG. 18, in the second pad group 312, one of the address input pad D-in and the address output pad D-out is adjacent to only one of other pads in the same line. That is, one of the address input pad D-in and the address output pad D-out is located at the end of the second line 3122 of the second pad group 312, while the other is sandwiched between two pads. In order to avoid interference between the cascade lines L and other routing wires, the cascade lines L can also pass through the gap between the first line 3121 and the second line 3122 of the second pad group 312.

Figure 19:
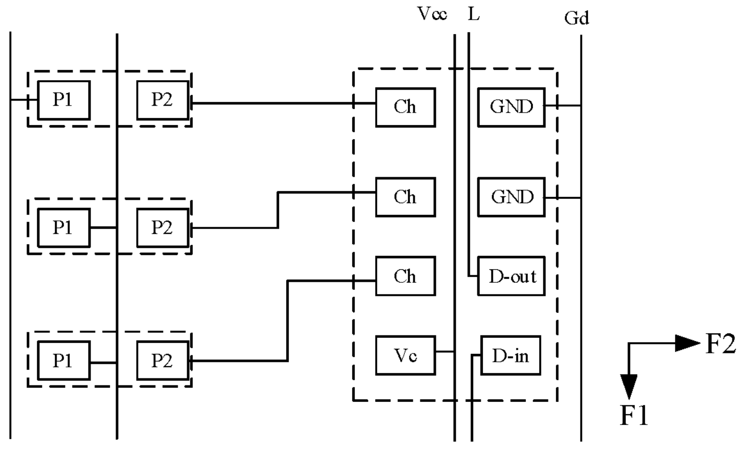
Figure 20:
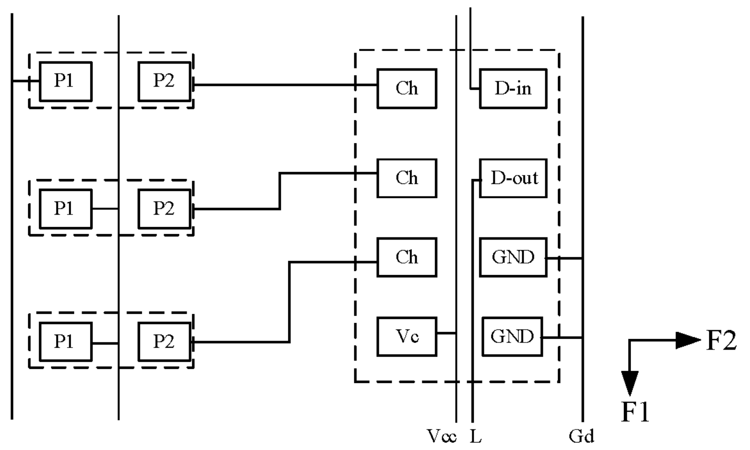
Figure 21:
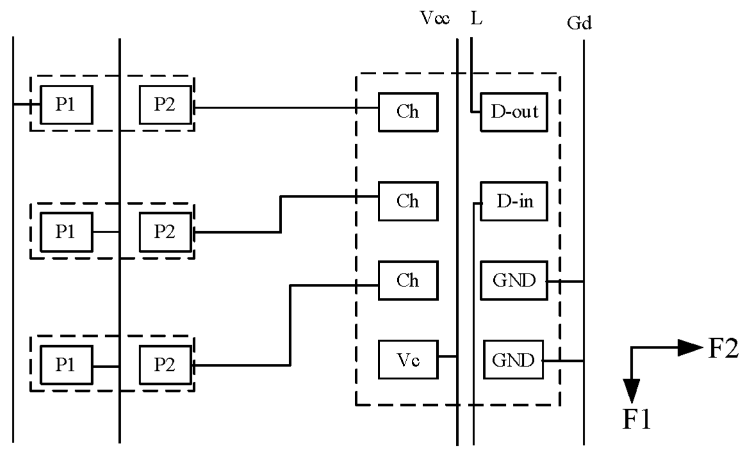
Figure 22:
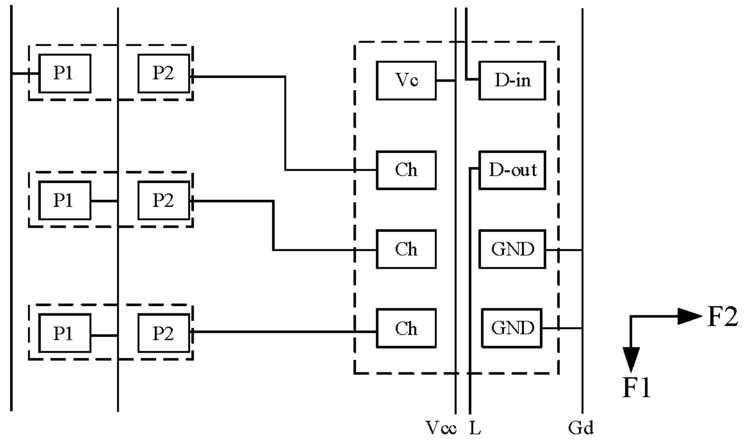
Figure 23:
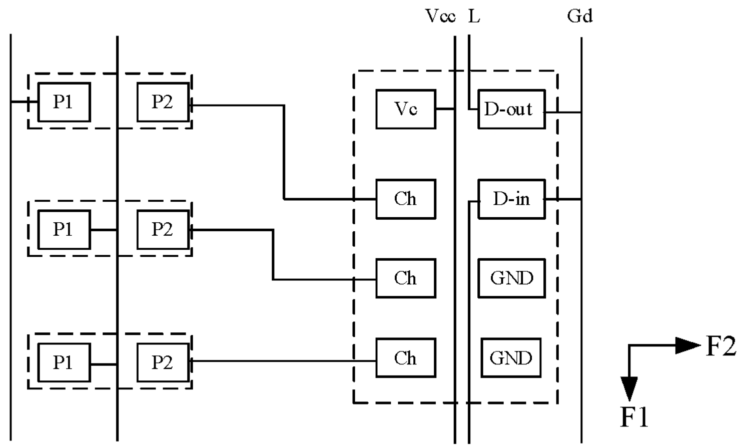
Figure 24:
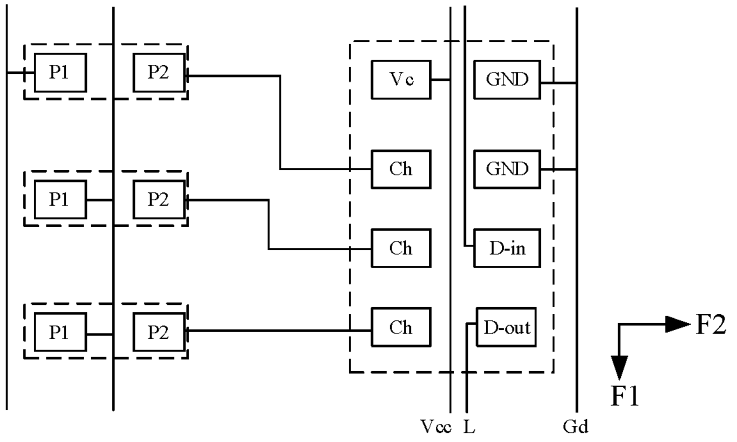
Figure 25:
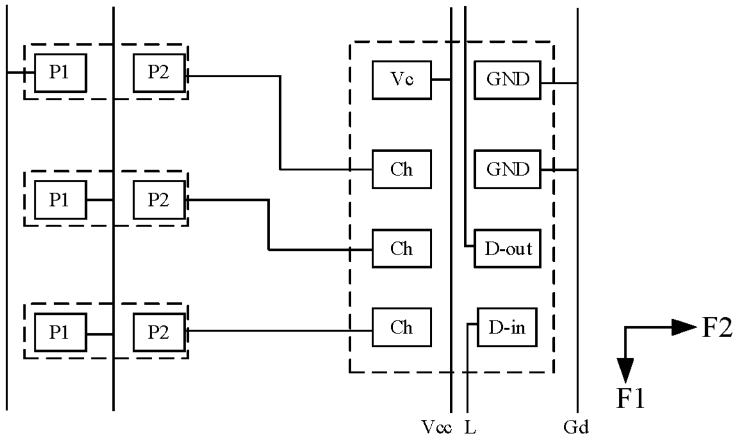

In this case, the arrangement layout of the pads in the second pad group 312 of the functional unit 31 is not limited to that shown in FIG. 18, but can be other implementations. For example, as shown in FIG. 19, the positions of the address input pad D-in and the address output pad D-out in FIG. 18 can be exchanged. Alternatively, as shown in FIG. 20, the position of the ground pad GND as well as the positions of the address input pad D-in and the address output pad D-out in FIG. 18 can be exchanged. Alternatively, as shown in FIG. 21, the positions of the address input pad D-in and the address output pad D-out in FIG. 20 can be exchanged; or as shown in FIG. 22, the positions of the plurality of channel pads Ch as well as the position of the signal pad Vc in FIG. 20 can be exchanged. Alternatively, as shown in FIG. 23, the positions of the address input pad D-in and the address output pad D-out in FIG. 22 can be exchanged. Alternatively, as shown in FIG. 24, the position of the ground pad GND as well as the positions of the address input pad D-in and the address output pad D-out in FIG. 22 can be exchanged. Alternatively, as shown in FIG.

25, the positions of the address input pad D-in and the address output pad D-out in FIG. 24 can be exchanged. The arrangement sequence of the pads in the second pad group 312 of the functional unit 31 can be determined according to actual conditions, which is not limited here.

In embodiments of the disclosure, in each of the functional units 31, the extension directions of the first line 3121 and the second line 3122 of the second pad group 312 can both be the second direction F2. In this case, the pads and trace layouts in each of the functional units 31 can be set according to the following structure.

Figure 26:
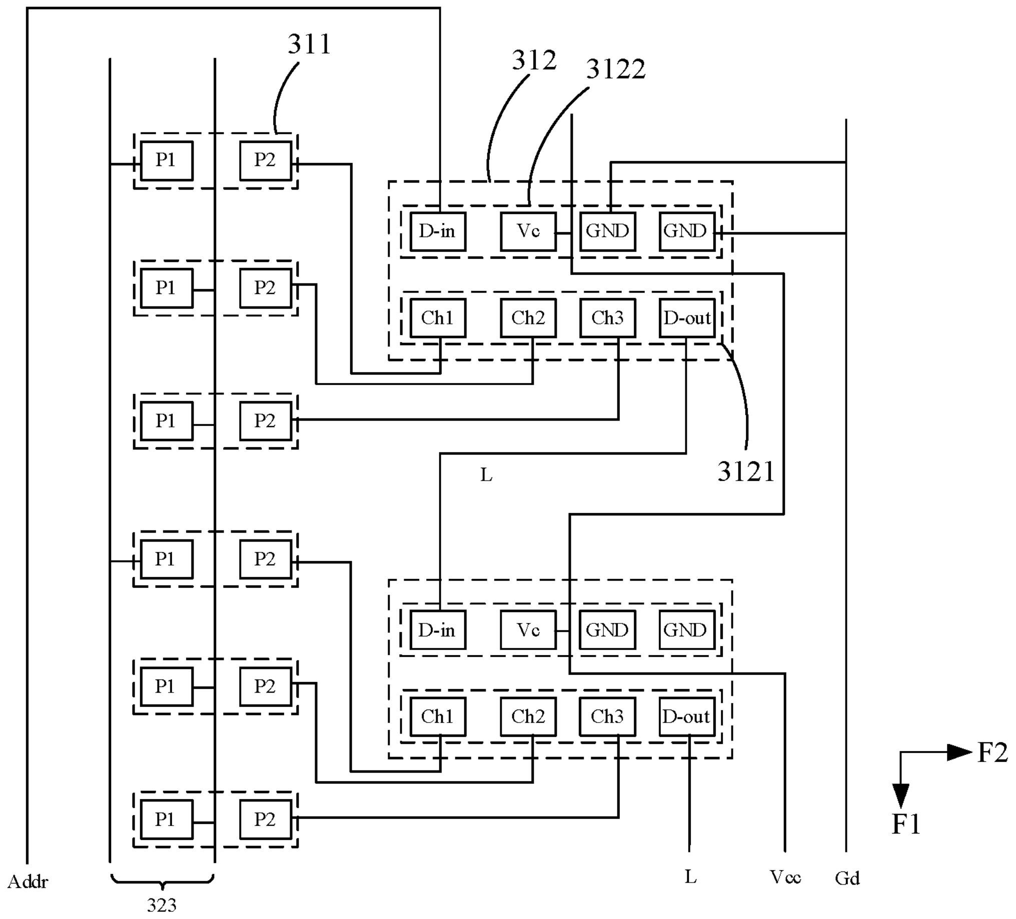
Figure 27:
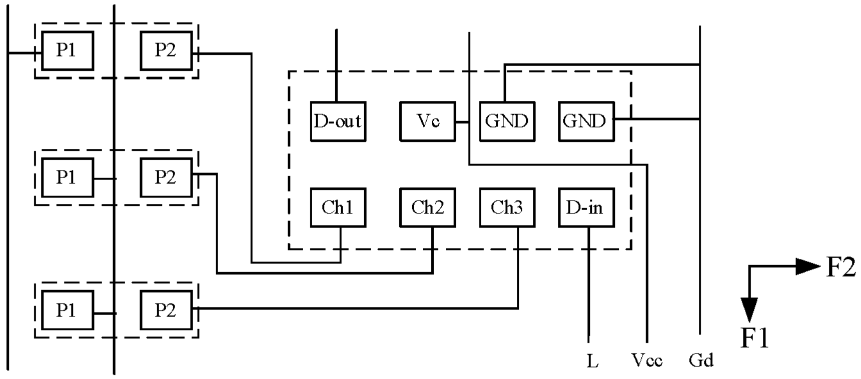

As shown in FIGS. 26 and 27, the specific layout structure on the wiring substrate corresponding to FIG. 26 can be as shown in FIGS. 8 and 9. In each of the functional units 31, one of the address input pad D-in and the address output pad D-out can be located in the first line 3121 of the second pad group 312, that is, one of the address input pad D-in and the address output pad D-out needs to be arranged at the end of the second pad group 312 away from the first pad groups 311. In this way, the other of the address input pad D-in and the address output pad D-out is located in the second line 3122 of the second pad group 312, and the cascade line L can be located between two adjacent functional units 31 in the same column of the functional units 31, avoiding mutual interference with other routing wires.

Optionally, as shown in FIGS. 26 and 27, in each of the functional units 31, at least one ground pad GND can be adjacent to the functional pad Gn in the first line 3121 of the second pad group 312. In this way, the ground line Gd can be located on the side of the second pad group 312 away from the plurality of first pad groups 311, avoiding mutual interference with other routing wires. The signal line Vcc can pass through the gap between the first line 3121 and the second line 3122 of the second pad group 312, avoiding interference with other routing wires.

Figure 28:
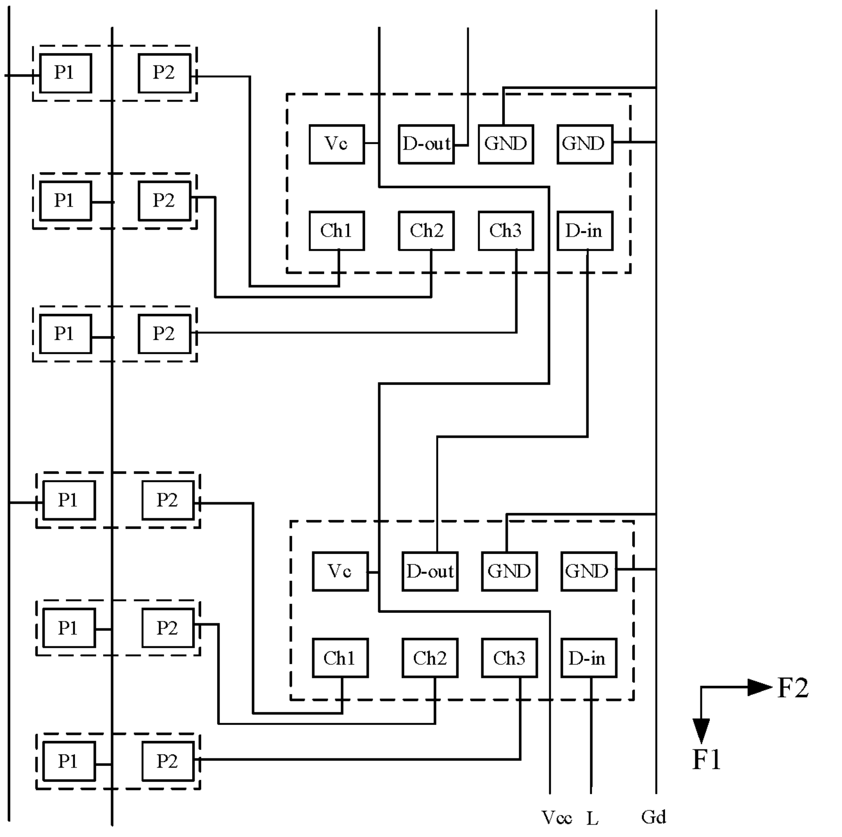

As shown in FIGS. 26 and 27, the signal pad Vc in the second pad group 312 can be sandwiched between two pads in the second line 3122. The signal line Vcc can pass through the gap between the first line 3121 and the second line 3122 of the second pad group 312 from a side of the second pad group 312 away from the first pad groups 311, so that there is no interference between the cascading line L and the signal line Vcc. Alternatively, as shown in FIG. 28, the signal pad Vc in the second pad group 312 can be located at an end of the second line 3122, and the signal line Vcc can pass through the gap between the functional pad Gn and the channel pad Ch in the first line 3121 of the second pad group 312 and the gap between the second line 3122 and the first line 3121.

Figure 29:
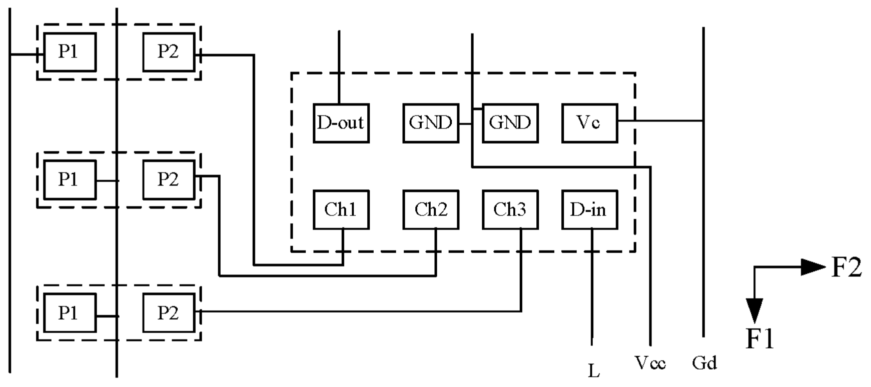

Optionally, as shown in FIG. 29, in each of the functional units 31, the signal pad Vc can also be adjacent to the functional pad Gn in the first line 3121 of the second pad group 312. The signal line Vcc can be located at a side of the second pad group 312 away from the plurality of first pad groups 311 along the second direction F2. The ground line Gd can be arranged in the gap between the first line 3121 and the second line 3122 of the second pad group.

In embodiments of the disclosure, as shown in FIGS. 16, 18 and 26, the above mentioned address line Addr can be located at a side of the routing wires of second type 323 away from the second pad group 312, and can be connected with the address input pad D-in in the first one of functional units 31 of the column of functional units 31 through a routing wire at a side of the array of the functional units 31.

Figure 30:
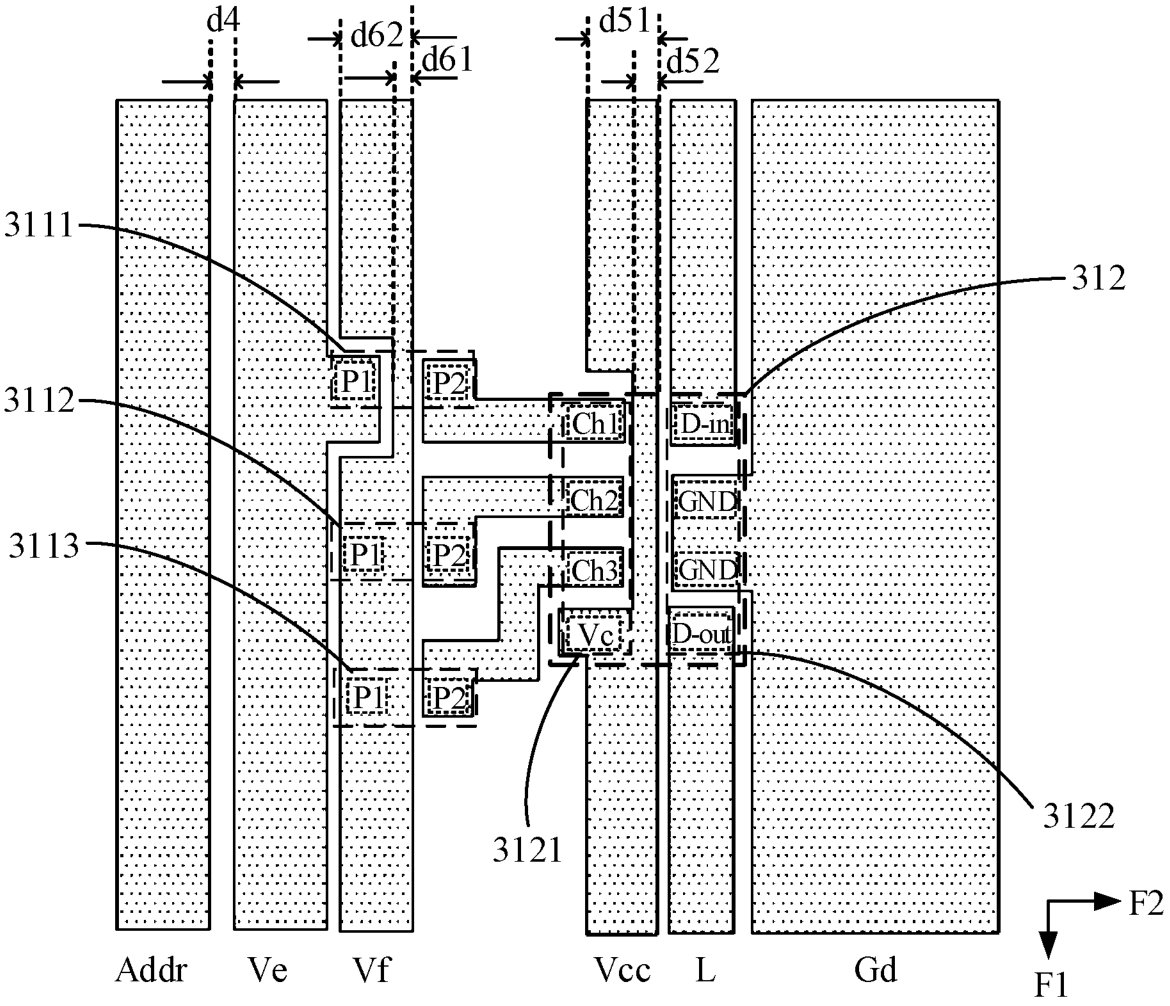
FIG. 30 is a schematic structural diagram of a functional unit and routing wires connected with the functional unit according to embodiments of the disclosure.

In practical applications, in order to better realize the functions of each routing wire, a minimum line width of the cascading line L, address line Addr, and signal line Vcc can be 30 μm, and a minimum line width of the ground line Gd can be 150 μm. For a better layout, the ground line Gd can be set at one side of the second pad group 312 away from the first pad groups 311 to ensure the width of the ground line Gd. The minimum line width requirement of the signal line Vcc or cascading line L is relatively small, which allows the signal line Vcc or cascading line L to pass through the gap between the first line 3121 and the second line 3122 of the second pad group 312. The signal line Vcc and cascading line L passing through the gap can both include a first body portion located outside a region of the second pad group 312 and a first through portion passing through the second pad group 312. The spacing between the two lines of pads in the second pad group 312 is limited in dimension, so that a line width of the first though portion is smaller than a line width of the first body portion. For example, as shown in FIG. 30, the spacing between two lines of pads in the second pad group 312 can range from 50 μm to 200 μm, the line width d51 of the first body portion of the signal line Vcc or the cascade line L can be set to be greater than or equal to 30 μm, and the line width d52 of the first through portion of the signal line Vcc or the cascade line L can be set to be greater than or equal to 5 μm. If the signal line Vcc or the cascade line L both are located between the gap of the lines of the pads in the second pad group 312, the line spacing between the signal line Vcc and the cascade line L can range from 5 μm to 20 μm. The specific dimensions can be determined based on actual process capability.

Figure 31:
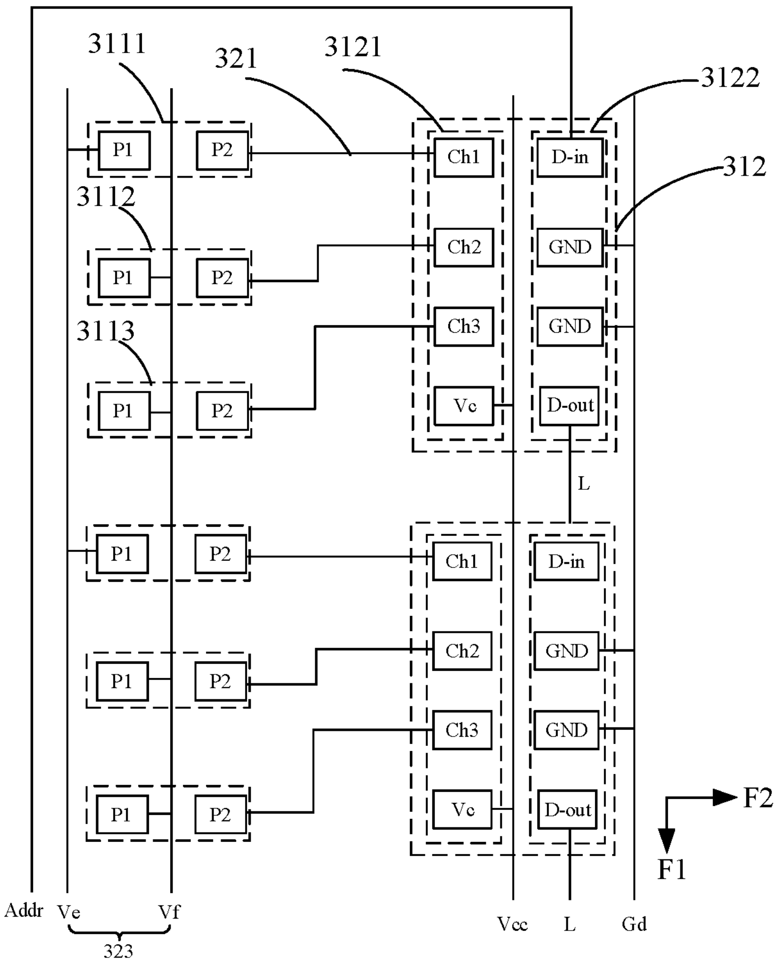
FIGS. 31-32 are schematic diagrams illustrating connections between a first pad group and routing wires of a second type according to embodiments of the disclosure. Reference numerals are as follows.
Figure 32:
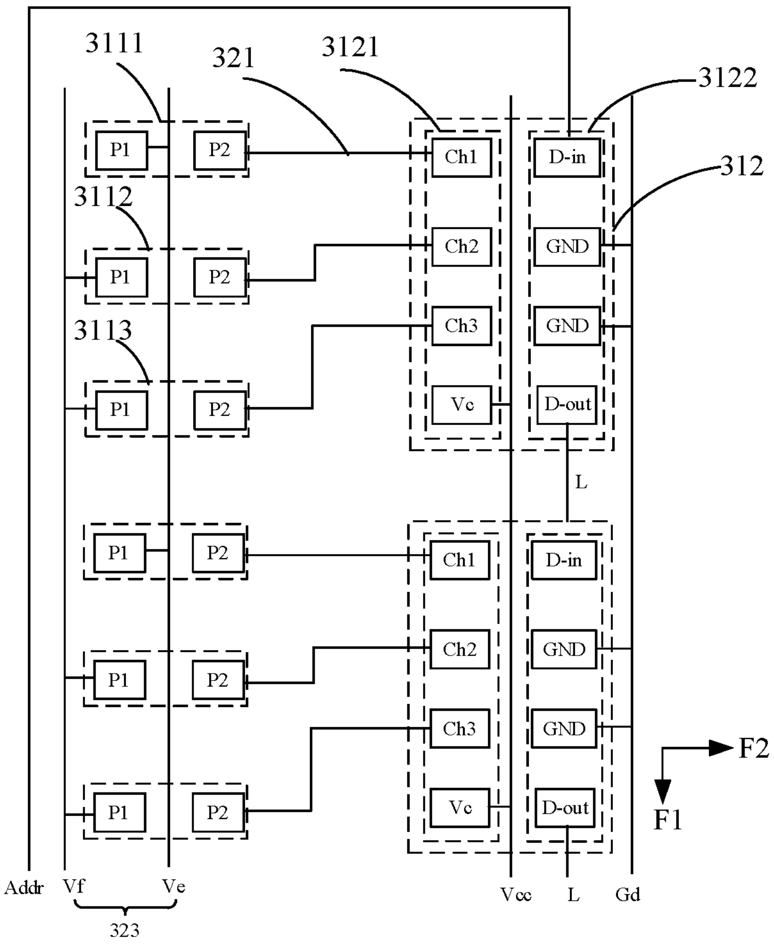

In embodiments of the disclosure, in each of the functional units 31, the plurality of first pad groups 311 are divided into two types, and first pad groups 311 of the same type are set to be adjacent. Specifically, as shown in FIGS. 31 and 32, each of the functional units 31 can include a first pad group 3111 connected with a red light-emitting element, a first pad group 3112 connected with a green light-emitting element, and a first pad group 3113 connected with a blue light-emitting element, here the light-emitting elements are generally light-emitting diodes (LEDs). In practical applications, the photoelectric characteristics of green LEDs and blue LEDs are basically the same, while the photoelectric characteristics of red LEDs are different from those of blue LEDs or green LEDs. Therefore, the power voltage required to be loaded to red LEDs is different from that required to be loaded to green LEDs and blue LEDs. Therefore, the first pad group 3111 can be regarded as the first pad group of first type, and the first pad groups 3112 and 3113 can be regarded as the first pad group of second type, and the first pad groups 3112 and 3113 are set adjacent to each other.

As shown in FIGS. 31 and 32, the routing wires of second type 323 can include two power lines with one power line connected with first pad groups 311 of one type in a column of functional units 31, where one power line is located at one side of the first pad groups away from the second pad group 312, and the other power line passes through the gap between the first sub-pads P1 and the second sub-pads P2 in the first pad groups 311.

For example, the routing wires of second type 323 can include a first power line Ve and a second power line Vf, where the first power line Ve is connected with the first sub-pad P1 of the first pad group 3111 in a column of functional units 31, and the second power line Vf is connected with the first pad groups 3112 and 3113 in the column of functional units 31. Specifically, as shown in FIG. 31, the specific layout structure on the corresponding wiring substrate can be as shown in FIGS. 5 and 6, where the first power line Ve is located at one side of the plurality of first pad groups 311 away from the second pad groups 312, and the second power line Vf passes through the gap between the first sub-pads P1 and the second sub-pads P2 in the first pad groups 311. Or, as shown in FIG. 32, the second power line Vf can be located at one side of the plurality of first pad groups 311 away from the second pad groups 312, and the first power line Ve passes through the gap between the first sub-pads P1 and the second sub-pads P2 in the first pad groups 311.

In practical applications, since the voltage loaded on the first power line Ve needs to be greater than the voltage loaded on the second power line Vf, a minimum width of the first power line Ve can be 100 μm, and a minimum width of the second power line Vf can be 50 μm. The power line passing through the gap between the first sub-pads P1 and the second sub-pads P2 can include a second body portion located outside a region of the first pad group 311 and a second through portion located between the first sub-pads P1 and the second sub-pads P2. Since the gap width between the first sub-pad P1 and the second sub-pad P2 is limited, the line width of the second through portion can be smaller than that of the second body portion. For example, as shown in FIG. 30, if the second power line Vf passes through the gap between the first sub-pads P1 and the second sub-pads P2, then the line width d61 of the second body portion of the second power line Vf can be 100 μm, and the line width d62 of the second through portion of the second power line Vf can be greater than or equal to 20 μm. Specific dimensions are not limited here and can be determined according to actual circumstances.

Embodiments of the disclosure further provide a light-emitting substrate, including any wiring substrate according to the above technical solutions, and a plurality of light-emitting elements connected one-to-one with the first pad groups and a plurality of driving elements connected one-to-one with second pad groups.

In the light-emitting substrate according to embodiments of the disclosure, one layer of metal routing wire layer is set in the wiring substrate, which can simplify the manufacturing process, improving product yield, and reduce the amount of mask boards used, significantly reducing production costs.

The manufacturing process of the above-mentioned light-emitting substrate can be as follows.

Step 1: a buffer layer is formed on a substrate by sputtering process, to reduce the stress impact of the subsequent metal routing wire layer on the substrate, reducing the warpage of the substrate. Here, the substrate can be a glass substrate.

Step 2: the metal routing wire layer is formed on the buffer layer by processes such as sputtering, cleaning, gluing, baking, exposure, development, hard baking, etching, and stripping. In addition, this metal routing wire layer can be completed by electroplating process.

Step 3: a single layer of insulation layer is formed by processes such as sputtering, exposure, and development.

Step 4: electroless nickel/immersion gold treatment is performed on a part of the metal routing wire layer exposed by opening in the insulation layer.

Step 5: white oil is coated on the insulation layer.

Step 6: process such as chip bonding is carried out, that is, the light-emitting elements and driving elements in the pixel unit are connected with the pads in the metal routing wire layer through openings.

Here, the above-mentioned light-emitting elements can be sub-millimeter light-emitting diodes (micro LEDs) or Micro LEDs, which are not limited here. The driving elements can be driver chips, which can be set according to actual conditions and are not limited here.

Embodiments of the disclosure further provide a display apparatus, including the light-emitting substrate according to the above technical solution.

Obviously, those skilled in the art can make various changes and modifications to the disclosed embodiments without departing from the spirit and scope of the disclosed embodiments. In this way, if these modifications and variations of embodiments of the disclosure fall within the scope of the claims of the disclosure and equivalent technologies, the disclosure is also intended to include these modifications and variations.

What is claimed is:

1. A wiring substrate comprising a plurality of functional units arranged in an array; wherein each of the functional units comprises:

a plurality of first pad groups arranged at intervals along a first direction, wherein each of the first pad groups comprises a first sub-pad and a second sub-pad spaced along a second direction; and a second pad group located at a side of the plurality of the first pad groups along the second direction, wherein the second pad group comprises a plurality of channel pads and at least two functional pads, and a—number—of pads in the second pad group is even and the pads in the second pad group are arranged at intervals in a 2*N array;

wherein, the plurality of channel pads are arranged at intervals along a same direction in a first line and are respectively connected one-to-one with a plurality of first pad groups of which a—number—is same as a—number—of the plurality of the channel pads; a functional pad in the at least two functional pads is located in the first line and is adjacent to one of the plurality of channel pads; and rest functional pads in the at least two functional pads are arranged at intervals along a same direction in a second line.

2. The wiring substrate according to claim 1, further comprising a plurality of routing wire groups arranged along the second direction; wherein a—number—of the plurality of routing wire groups is same as a—number—of columns of functional units, and each of the routing wire groups is connected with a column of functional units;

each of the routing wire groups comprises a plurality of connection lines, routing wires of first type and routing wires of second type; wherein the plurality of connection lines are used to connect channel pads respectively to second sub-pads in the column of functional units, the routing wires of first type are connected with functional pads in the column of functional units, and the routing wires of second type are connected with first sub-pads in the column of functional units;

the routing wires of first type and the routing wires of second type are arranged along the second direction and extend along the first direction; at least one of the routing wires of first type passes through a gap between the first line and the second line of the second pad group in the column of functional units, and at least one of the routing wires of second type passes through a gap between the first sub-pads and the second sub-pads in the column of functional units, so that routing wires in the plurality of routing wire groups are set in a same layer.

3. The wiring substrate according to claim 2, wherein in each of the functional units, the plurality of channel pads are arranged respectively adjacent to second sub-pads in the plurality of first pad groups along the second direction, and an arrangement order of the channel pads matches with an arrangement order of corresponding first pad groups.

4. The wiring substrate according to claim 3, wherein in each of the functional units, the at least two functional pads comprise a signal pad, an address input pad, an address output pad and at least one ground pad; any one of the signal pad, the address input pad and the address output pad is located in the first line of the second pad group, and at least one of the address input pad and the address output pad is adjacent to one of other pads in a line where the at least one of the address input pad and the address output pad is located.

5. The wiring substrate according to claim 4, wherein the routing wires of first type comprises: a signal line connected with all signal pads in a corresponding column of functional units; a ground line connected with all ground pads in a corresponding column of functional units; a plurality of cascade lines, configured to cascade every adjacent two functional units in a column of functional units, wherein an end of the cascade line is connected with an address output pad of a previous functional unit and the other end of the cascade line is connected with an address input pad of a next functional unit;

and an address line connected with an address input pad of a first one of functional units in a corresponding column of functional units.

6. The wiring substrate according to claim 5, wherein in each of the functional units, extension directions of the first line and the second line in the second pad group both are the first direction.

7. The wiring substrate according to claim 6, wherein in each of the functional units, the signal pad is located in the first line of the second pad group; the signal line passes through a gap between the first line and the second line in the second pad group; the ground line is located at a side of the second pad group away from the first pad groups.

8. The wiring substrate according to claim 7, wherein in the second pad group, the address input pad is adjacent to one of other pads in a line where the address input pad is located, and the address output pad is adjacent to one of other pads in a line where the address output pad is located; the cascade line is located between two adjacent functional units in a column of functional units.

9. The wiring substrate according to claim 7, wherein in the second pad group, one of the address input pad and the address output pad is adjacent to one of other pads in a line where the one of the address input pad and the address output pad is located; the cascade line is located between the first line and the second line of the second pad group.

10. The wiring substrate according to claim 5, wherein in each of the functional units, extension directions of the first line and the second line in the second pad group both are the second direction.

11. The wiring substrate according to claim 10, wherein in each of the functional units, one of the address input pad and the address output pad is located in the first line of the second pad group; the cascade line is located between two adjacent functional units in a column of functional units.

12. The wiring substrate according to claim 11, wherein in each of the functional units, the at least one ground pad is adjacent to a functional pad in the first line of the second pad group; the ground line is located at a side of the second pad group away from the first pad groups along the second direction;

the signal line passes through a gap between the first line and the second line of the second pad group.

13. The wiring substrate according to claim 11, wherein in each of the functional units, the signal pad is adjacent to a functional pad in the first line of the second pad group; the signal line is located at a side of the second pad group away from the first pad groups along the second direction; the ground line is located between the first line and the second line in the second pad group.

14. The wiring substrate according to claim 5, wherein the address line is located a side of the routing wires of second type away from the second pad group.

15. The wiring substrate according to claim 4, wherein the second pad group comprises two ground pads which are arranged adjacent to each other.

16. The wiring substrate according to claim 3, wherein in each of the functional units, the plurality of first pad groups are divided into two types, and first pad groups of a same type are arranged adjacent to each other; the routing wires of second type comprises two power lines, and a power line is connected with first pad groups of a type in a column of functional units, wherein one power line of the two power lines is located at a side of the first pad groups away from the second pad group, and the other one power line of the two power lines passes through a gap between the first sub-pads and the second sub-pads in the first pad groups.

17. A light-emitting substrate, comprising the wiring substrate according to a claim 1, and a plurality of light-emitting elements connected one-to-one with the first pad groups and a plurality of driving elements connected one-to-one with second pad groups.

18. A display apparatus, comprising the light-emitting substrate according to claim 17.

* * * * *